United States Patent
Bhattacharyya

(10) Patent No.: US 10,262,736 B2
(45) Date of Patent: Apr. 16, 2019

(54) MULTIFUNCTIONAL MEMORY CELLS

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/641,691

(22) Filed: Jul. 5, 2017

(65) Prior Publication Data

US 2019/0013074 A1 Jan. 10, 2019

(51) Int. Cl.
| | |
|---|---|
| *G11C 14/00* | (2006.01) |
| *H01L 29/20* | (2006.01) |
| *H01L 29/51* | (2006.01) |
| *H01L 27/11568* | (2017.01) |
| *H01L 27/108* | (2006.01) |
| *H01L 49/02* | (2006.01) |
| *G11C 16/04* | (2006.01) |
| *H01L 29/49* | (2006.01) |

(52) U.S. Cl.
CPC .... *G11C 14/0018* (2013.01); *H01L 27/10805* (2013.01); *H01L 27/11568* (2013.01); *H01L 28/40* (2013.01); *H01L 29/2003* (2013.01); *H01L 29/513* (2013.01); *H01L 29/517* (2013.01); *H01L 29/518* (2013.01); *G11C 16/0466* (2013.01); *H01L 29/4966* (2013.01)

(58) Field of Classification Search
CPC . G11C 14/0018; G11C 16/0466; H01L 28/40; H01L 27/10805; H01L 29/513; H01L 29/517; H01L 29/518; H01L 29/2003; H01L 27/11568; H01L 29/4966
See application file for complete search history.

(56) References Cited

U.S. PATENT DOCUMENTS

| | | | |
|---|---|---|---|
| 4,870,470 A | 9/1989 | Bass et al. | |
| 6,743,681 B2 | 6/2004 | Bhattacharyya | |
| 6,743,682 B2 | 6/2004 | Woerlee et al. | |
| 6,888,200 B2 * | 5/2005 | Bhattacharyya ... | G11C 16/0466 257/348 |
| 6,888,755 B2 | 5/2005 | Harari | |
| 6,903,969 B2 | 6/2005 | Bhattacharyya | |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Khamdan N. Alrobaie
(74) *Attorney, Agent, or Firm* — Brooks, Cameron & Huebsch, PLLC

(57) ABSTRACT

The present disclosure includes multifunctional memory cells. A number of embodiments include a charge transport element having an oxygen-rich silicon oxynitride material, a volatile charge storage element configured to store a first charge transported through the charge transport element, and a non-volatile charge storage element configured to store a second charge transported through the charge transport element, wherein the non-volatile charge storage element includes a gallium nitride material.

34 Claims, 8 Drawing Sheets

(56) References Cited

U.S. PATENT DOCUMENTS

| | | | |
|---|---|---|---|
| 6,917,078 | B2 | 7/2005 | Bhattacharyya |
| 6,998,667 | B2 | 2/2006 | Bhattacharyya |
| 7,012,297 | B2 | 3/2006 | Bhattacharyya |
| 7,042,027 | B2 | 5/2006 | Bhattacharyya |
| 7,130,216 | B2 | 10/2006 | Bhattacharyya |
| 7,145,186 | B2 | 12/2006 | Bhattacharyya |
| 7,158,410 | B2 | 1/2007 | Bhattacharyya et al. |
| 7,166,888 | B2 | 1/2007 | Bhattacharyya |
| 7,184,312 | B2 | 2/2007 | Bhattacharyya |
| 7,208,793 | B2 | 4/2007 | Bhattacharyya |
| 7,224,002 | B2 | 5/2007 | Bhattacharyya |
| 7,244,981 | B2 | 7/2007 | Bhattacharyya |
| 7,250,628 | B2 | 7/2007 | Bhattacharyya |
| 7,273,784 | B2 | 9/2007 | Bhattacharyya |
| 7,276,760 | B2 | 10/2007 | Bhattacharyya |
| 7,279,740 | B2 * | 10/2007 | Bhattacharyya ...... H01L 27/115 257/324 |
| 7,294,547 | B1 | 11/2007 | Orimoto et al. |
| 7,339,239 | B2 | 3/2008 | Forbes |
| 7,339,830 | B2 | 3/2008 | Bhattacharyya |
| 7,349,252 | B2 | 3/2008 | Bhattacharyya et al. |
| 7,365,388 | B2 | 4/2008 | Bhattacharyya |
| 7,379,336 | B2 | 5/2008 | Bhattacharyya et al. |
| 7,385,245 | B2 | 6/2008 | Bhattacharyya |
| 7,400,012 | B2 | 7/2008 | Bhattacharyya |
| 7,403,416 | B2 | 7/2008 | Bhattacharyya et al. |
| 7,417,893 | B2 | 8/2008 | Bhattacharyya et al. |
| 7,429,767 | B2 | 9/2008 | Bhattacharyya |
| 7,432,562 | B2 | 10/2008 | Bhattacharyya |
| 7,436,018 | B2 | 10/2008 | Bhattacharyya |
| 7,440,310 | B2 | 10/2008 | Bhattacharyya |
| 7,440,317 | B2 | 10/2008 | Bhattacharyya |
| 7,456,054 | B2 | 11/2008 | Bhattacharyya |
| 7,457,159 | B2 | 11/2008 | Bhattacharyya et al. |
| 7,459,740 | B2 | 12/2008 | Bhattacharyya et al. |
| 7,476,927 | B2 | 1/2009 | Bhattacharyya |
| 7,482,651 | B2 | 1/2009 | Bhattacharyya |
| 7,485,513 | B2 | 2/2009 | Bhattacharyya |
| 7,525,149 | B2 | 4/2009 | Bhattacharyya et al. |
| 7,528,043 | B2 | 5/2009 | Bhattacharyya |
| 7,544,990 | B2 | 6/2009 | Bhattacharyya |
| 7,553,735 | B2 | 6/2009 | Bhattacharyya |
| 7,579,242 | B2 | 8/2009 | Bhattacharyya |
| 7,612,403 | B2 | 11/2009 | Bhattacharyya |
| 7,625,803 | B2 | 12/2009 | Bhattacharyya |
| 7,629,641 | B2 | 12/2009 | Bhattacharyya |
| 7,662,693 | B2 | 2/2010 | Bhattacharyya |
| 7,671,407 | B2 | 3/2010 | Bhattacharyya |
| 7,728,350 | B2 | 6/2010 | Bhattacharyya |
| 7,749,848 | B2 | 7/2010 | Bhattacharyya et al. |
| 7,750,395 | B2 | 7/2010 | Bhattacharyya |
| 7,759,715 | B2 | 7/2010 | Bhattacharyya |
| 7,768,062 | B2 | 8/2010 | Bhattacharyya et al. |
| 7,786,516 | B2 | 8/2010 | Bhattacharyya |
| 7,838,362 | B2 | 11/2010 | Bhattacharyya |
| 7,851,827 | B2 | 12/2010 | Bhattacharyya |
| 7,867,850 | B2 | 1/2011 | Bhattacharyya |
| 7,898,022 | B2 | 3/2011 | Bhattacharyya |
| 7,956,426 | B2 | 6/2011 | Bhattacharyya |
| 7,964,909 | B2 | 6/2011 | Bhattacharyya |
| 7,968,402 | B2 | 6/2011 | Bhattacharyya |
| 8,058,118 | B2 | 11/2011 | Bhattacharyya |
| 8,063,436 | B2 | 11/2011 | Bhattacharyya |
| 8,125,003 | B2 | 2/2012 | Bhattacharyya |
| 8,143,657 | B2 | 3/2012 | Bhattacharyya |
| 8,159,875 | B2 | 4/2012 | Bhattacharyya |
| 8,193,568 | B2 | 6/2012 | Bhattacharyya |
| 8,228,743 | B2 | 7/2012 | Min et al. |
| 8,242,554 | B2 | 8/2012 | Bhattacharyya |
| 8,264,041 | B2 * | 9/2012 | Okhonin ............ G11C 11/404 257/347 |
| 2002/0187610 | A1 | 12/2002 | Furukawa et al. |
| 2007/0034922 | A1 | 2/2007 | Bhattacharyya |
| 2007/0045706 | A1 | 3/2007 | Bhattacharyya et al. |
| 2007/0155100 | A1 * | 7/2007 | Tseng ................ H01L 29/42324 438/257 |
| 2008/0073704 | A1 * | 3/2008 | Yasuda ............ H01L 21/28282 257/324 |
| 2008/0123418 | A1 * | 5/2008 | Widjaja ................ G11C 11/404 365/185.08 |
| 2008/0303080 | A1 | 12/2008 | Bhattacharyya |
| 2009/0283816 | A1 * | 11/2009 | Tian ...................... H01L 29/792 257/321 |
| 2010/0090265 | A1 | 4/2010 | Bhattacharyya et al. |
| 2011/0233631 | A1 * | 9/2011 | Son ...................... H01L 27/105 257/298 |
| 2012/0163071 | A1 * | 6/2012 | Kurokawa ............ G11C 11/405 365/174 |

OTHER PUBLICATIONS

Bhattacharyya et al., "Properties and Applications of Silicon Oxynitride Films", from IBM Technical Report TR. 19.0399, presented at the Electrochemical Society (ECS) 150th Meeting, Oct. 1976, Las Vegas, NV, 20 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS

(56) References Cited

OTHER PUBLICATIONS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 645-648.

Lue et al., "A Novel P-Channel NAND-type Flash Memory with 2 bit/cell Operation and High Programming Throughput (> 20 Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p- MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al., Novel ZrO2/Si3N4 Dual Charge Storage Layer to Form Step-up Potential Wells for Highly Reliable Multi-level Cell Application, IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

\* cited by examiner

MULTIFUNCTIONAL MEMORY CELLS

TECHNICAL FIELD

The present disclosure relates generally to semiconductor memory and methods, and more particularly, to multifunctional memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), static random access memory (SRAM), and synchronous dynamic random access memory (SDRAM), among others. Non-volatile memory can provide persistent data by retaining stored data when not powered and can include NROM flash memory, NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile and/or volatile memory may be used in, for example, personal computers, portable memory sticks, solid state drives (SSDs), digital cameras, cellular telephones, portable music players such as MP3 players, and movie players, among other electronic devices.

Memory cells in an array architecture can be programmed to a target (e.g., desired) state. For instance, electric charge can be placed on or removed from the charge storage structure (e.g., floating gate) of a field effect transistor (FET) based memory cell to program the cell to a particular data state. The amount of stored charge on the charge storage structure of an FET-based memory cell can be indicated by a resulting threshold voltage (Vt) state of the cell.

For example, a single level memory cell (SLC) can be programmed to a targeted one of two different data states, which can be represented by the binary units 1 or 0. A binary data state represents 1 bit of data with $2^1$ (e.g., 2) data states. As an additional example, some memory cells can be programmed to a targeted one of more than two data states, such as, for instance, to a targeted four bits of data with $2^4$ (e.g., 16) data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit), and therefore can provide high data storage capacity.

DETAILED DESCRIPTION

Figure 1:
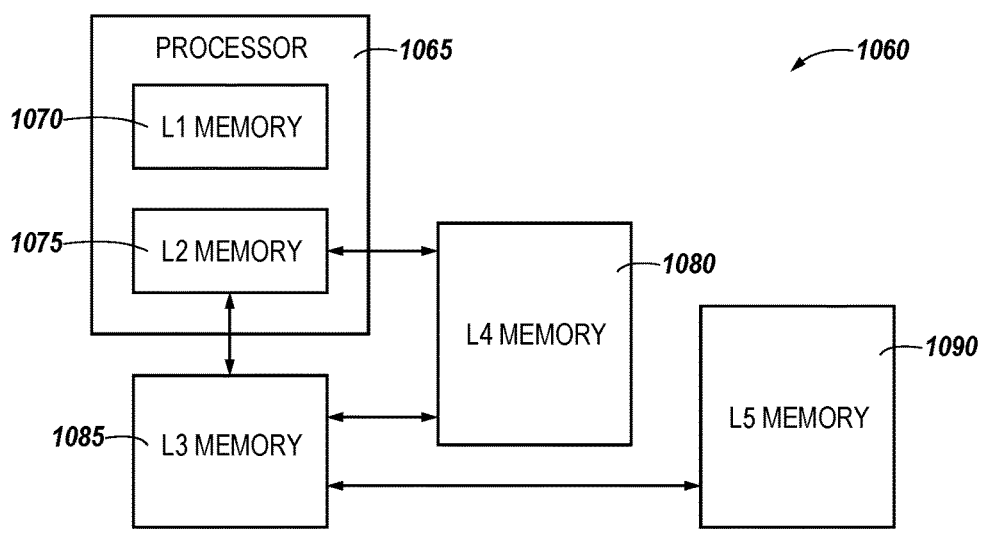
FIG. 1 is a block diagram that illustrates an example of an apparatus in accordance with an embodiment of the present disclosure.

The present disclosure includes multifunctional memory cells. A number of embodiments include a charge transport element having an oxygen-rich silicon oxynitride material, a less-nonvolatile (e.g., volatile) charge storage element configured to store a first charge transported through the charge transport element, and a non-volatile charge storage element configured to store a second charge transported through the charge transport element, wherein the non-volatile charge storage element includes a gallium nitride material.

Memory cells in accordance with the present disclosure can have the characteristics (e.g., performance characteristics) and/or attributes of both a less-nonvolatile (e.g., volatile) memory cell and a non-volatile memory cell within the framework of a single cell. For example, memory cells in accordance with the present disclosure can simultaneously function (e.g., operate) as both less-nonvolatile and non-volatile memory cells. Such memory cells can be referred to herein as multifunctional memory cells.

Multifunctional memory cells in accordance with the present disclosure can be used to functionally replace traditional memory cells, such as traditional SRAM, DRAM, and/or flash (e.g., NROM and/or NAND flash) memory cells, used in previous memory devices. For example, multifunctional memory cells in accordance with the present disclosure can have a single memory cell design that can be utilized in a single memory array and single logic circuitry design, while simultaneously meeting the performance characteristics and/or attributes of traditional SRAM, DRAM, and/or flash memory arrays previously provided through different cell, array, and logic circuitry designs.

For example, multifunctional memory cells in accordance with the present disclosure can function as high capacity memory, such as, for instance, for caching and/or for storage of central processing (e.g., CPU) functions, while simultaneously functioning as high performance memory, such as, for instance, for working memory storage and/or for large capacity file storage (e.g., for operating systems and/or apps). In contrast, previous memory devices may utilize different types of volatile and non-volatile memory cells, with different array and logic circuitry designs, to achieve such functionality. For instance, previous memory devices may utilize SRAM and/or DRAM cells for higher speed functionality, while utilizing flash memory cells for long-duration (e.g., file) storage functionality.

As such, memory devices that utilize multifunctional memory cells in accordance with the present disclosure can have a lower cost, consume less power, and/or have a higher performance than previous memory devices that utilize different types of memory cells to separately achieve volatile and non-volatile functionality. Further, multifunctional memory cells in accordance with the present disclosure can be multilevel cells (MLCs), thereby achieving high storage density and/or capacity. Further, multifunctional memory cells in accordance with the present disclosure can be configured in planar arrays (e.g., planar channel FET-based) that may be vertically stackable in a three-dimensional memory array and/or alternatively may be configured in vertical planes (e.g., vertical channel FET based) in the form of three-dimensional memory arrays.

As used herein, "a" or "an" can refer to one or more of something, and "a plurality of" can refer to more than one of such things. For example, a memory cell can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits.

FIG. 1 is a block diagram that illustrates an example of an apparatus in the form of an electronic system 1060 in accordance with an embodiment of the present disclosure. System 1060 can be, for example, a computer system, a memory system, a hand-held device, a cell phone, etc. FIG. 1 illustrates an example of a memory hierarchy associated with electronic system 1600. In this example, the memory hierarchy may include levels L1 to L5. As an example, levels L1 to L5 may be defined by memory characteristics (e.g., access speed, and or cycle speed, and or the data throughput, memory cell size, reliability, endurance, volatility, memory-window size, etc.). For example, in going from level L1 to level L5, the access speed, and the cycle speed, and the data throughput may progressively decrease, while the nonvolatility and storage capacity of the memory type may increase.

Note that the data access speed, for example, may be related to the read access time of the memory that implies the time it takes to ensure the binary ("1" or "0") state of any particular memory bit within a memory array (e.g., the higher the access speed, the lower the access time). For example, the cycle time may imply the time it takes to not only establish the binary memory state of any storage bit (either 1, or 0) through programming ("write" and or "erase") of the specific bit within the memory array, but also the time to ensure the memory state which is the access time.

Memory delay (e.g., memory latency) may imply the time it takes for the memory bit to arrive at the processor node once the processor fetches the memory bit triggered by a unit of a clock cycle of the processor, for example. Memory bandwidth (e.g., memory throughput), for example, may be related and inversely proportional to the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) may be employed, for example, the processor may execute an assigned task (e.g. any specific function or program) faster and the performance of a system (e.g., digital system) may be improved.

Memory volatility may be related to two aspects of retention of the memory state of any memory bit. One aspect of retention may be the retention of a memory state when the power is available to the memory array, implying that no re-writing (e.g., refreshing), such as re-establishing, the memory state is required during a time period. This aspect of retention may be longer for SRAM and shorter (in the order of milliseconds) for DRAM. Therefore, DRAM may require frequent refreshing of a memory state even when the power is on for the memory array. The other aspect of memory retention, for example, may be the ability to retain a written (e.g., established) memory state of any bit when there is no power to the memory array. Memory state retention of this type might be about 10 years for some nonvolatile memories of some SSDs (NROMs or NAND types of memory cells) and HDDs (magnetic tapes or disks).

When power is not available, for example, the memory states of SRAMs and DRAMs may be lost. Therefore, these types of memories may be classified as volatile memories. For non-volatile memories, for example, the lower the degree of volatility, the longer the memory retains data, and thus the greater the retention. For example, SDDs may, in general, be less nonvolatile compared to HDDs, where HDDs could retain data for centuries in properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NAND, for example, may have at least one year of nonvolatility for most of the applications for which such memories are employed.

Another important property of memory, for example, may be the number of times memory binary states may be "written" or altered or "programmed" during the life time of the electronic system. In some examples, systems, such as memory systems, may be assumed to last for about 10 years, during which some memory bits may be altered for as many as thousand trillion times (1E15 times). The SRAMs and DRAMs, might, for example, withstand such re-programming known as "endurance." Endurance limits of some NROMs, for example, may be about 10 million times, while those of some NAND flash memories may be about 100,000 times to about one million times. This may limit the application of current NROMs and NANDs for L1, L2, and L3 memory applications, besides their significantly slower cycle time compared to SRAMs and DRAMs.

Electronic system 1060 may include a processor 1065, such as a microprocessor, that may control electronic system 1060. Processor 1065 may include a memory 1070, such as a logic memory, having a memory level L1. For example, a conventional L1-level memory may be an SRAM volatile memory. Processor 1065 may also include a memory 1075, such as a cache memory, that may have a memory level L2, for example. In some examples, processor 1065 may include a built-in memory management unit (MMU) not shown in the drawing. In some examples, the MMU (not shown) may be coupled to L2 and other memory levels. An example of a conventional L2-level memory may be an SRAM volatile cache memory.

Advantages of SRAM may include, for example, high performance (e.g., high data throughput), and high endurance required for L1/L2-level functionality, and ease of fabrication (e.g., that may be compatible with complementary-metal-oxide-semiconductor (CMOS) fabrication techniques). Disadvantages of SRAM may include, limiting memory capacity, due, for example, to relatively large memory cell sizes (e.g., with a form factor F×F of about 50 to about 80) and volatility.

Memory 1075 may be coupled to a memory 1080, as shown in FIG. 1. Memory 1075 may also be coupled to a memory 1085, and memory 1085 may be coupled to memory 1080, for example. As used in the examples herein, the term "coupled" may include directly coupled and/or directly connected with no intervening elements (e.g., by direct physical contact) or indirectly coupled and/or connected with intervening elements, such as an MMU (not shown).

Memory 1085 may be a main memory (e.g., a working memory) and may have a memory level L3. An example of a conventional L3-level memory may be a DRAM volatile memory. Advantages of DRAM, for example, may include relatively higher performance compared to non-volatile memories (e.g., read, write, and erase times of less than about 10 nanoseconds), relatively small (e.g., an F×F of about 6 to about 8) one-transistor-one-capacitor memory cells, yielding higher capacity, and relatively higher performance with lower cycle time to provide L3-level functionality. DRAM, for example, may provide relatively high endurance at the expense of power consumption for frequent refreshing of the memory states. Disadvantages of DRAM may include, for example, fabrication (e.g., customized CMOS fabrication for the capacitor may be required), scalability (e.g., may be difficult to scale to below 30 nanometers), and volatile memory cells (e.g., data may need to be refreshed about every millisecond).

Memory 1080 may be a storage memory (e.g., for storing data and/or code) and may have a memory level L4. Examples of L4-level memory may include non-volatile NOR memory, non-volatile NAND memory, and non-volatile NROM. In some examples, memory 1080 may be referred to as a solid-state memory.

Advantages of NROM (e.g., NROM flash) may include, for example, relatively high read performance (e.g., fast reads), non-volatile memory cells, relatively small (e.g., an F×F of about 6) random-access-one-transistor memory cells, multiple-bit-per cell storage capability, basic-input/output-system (BIOS) functionality, code storage capability, and fabrication (e.g., compatible with CMOS fabrication techniques). Disadvantages of NROM may include, for example, relatively slow writes, relatively high programming voltages, relatively low read/write endurance, and relatively poor durability.

Advantages of NAND (e.g., NAND flash) may include, for example, small (e.g., an F×F of about 4) one-transistor memory cells with single-bit- and multiple-bit-per cell storage capability, non-volatile memory cells, and high storage capacity per mm$^2$ of silicon. Disadvantages of NAND may include, for example, relatively slow write speeds (e.g., about 1.0 to about 10 millisecond), relatively slow access (e.g., serial/parallel memory access), and relatively low write/erase (W/E) endurance (e.g., about $10^3$ to about $10^5$ W/E cycles).

Memory 1085 may be coupled to a memory 1090, having a memory level L5, for example. Examples of conventional L5-level memories may include magnetic memory (e.g., magnetic tapes) and/or optical memory (e.g., optical discs) for storing data. In some examples, memory 1090 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy, such as that described above, may advantageously employ, for example, the memories described above, such as the L1- to L5-level memories (e.g., SRAM, DRAM, NROM, NAND, and HDD) to fulfill system functionality objectives with cost, capability, power, performance, form-factor, portability, and applications in mind. The hierarchy may require communication between various memories and, therefore, for example, may disadvantageously involve a significant amount of peripheral logic, power, cost, performance compromises, form-factor constraints, reliability issues, and durability issues. This, for example, may suggest a "one-type-fits-all" approach to memory design (e.g., a novel one-type-fits-all memory). Except for HDD, some processors and memories may (e.g., all) be silicon based, and the memory cell structure may (e.g., all) be similar and may be built using scaled CMOS field-effect transistor technology, for example.

There may be a need for memories that may include silicon-based non-volatile one-transistor memory cells that may simultaneously satisfy the speed, power, and/or durability requirements of L2-, L3-, and L4-level memories. Such a memory cell may be referred to herein as a multi-functional memory cell.

There may be a need for memories with multifunctional capability to maintain their information or data when there is a loss of power. There may be a need for memories to simultaneously store the shorter retention data for end-of-life storage within the same memory cell. There may be a need, for example, to do away with the conventional memory hierarchy (e.g., in favor of a non-hierarchical organization) that may result in faster communication with the processor. Such a memory may be referred to herein as silicon based-unified multifunctional memory, or MSUM memory.

There may also be a need to extend the MSUM memory cell capability to provide higher capacity data storage within the memory cell in order to achieve MLC capability. Such a memory cell design may be referred to herein as an MLC MSUM cell.

Embodiments of the present disclosure include memory that may include, for example, non-volatile memory cells in which an active element, such as a field-effect transistor, may be integrated with a dielectric stack that can store a charge in the gate stack of the field-effect transistor. The gate stack may control the entire transistor channel or part of the transistor channel in the memory cell design. In some examples, such a memory might be referred as MSUM. In some examples, the design of dielectric stack may be varied to incorporate L4 or L5 level MLC storage capacity. Such a memory cell might be referred as MLC MSUM. In some examples, the design of the dielectric stack may be varied so that the non-volatile memory cell (e.g., a MSUM memory cell) may operate simultaneously as a L2-, L3-, L4-, or L5-level memory cell. For example, the memory cells disclosed herein may have higher performance, lower power consumption, and higher reliability than, for example, some conventional NVM cells. Employing such a memory cell in the framework of sub-arrays and arrays may eliminate the need of conventional memory hierarchy, thereby improving memory and system attributes.

In some examples, field-effect-transistor- (e.g., FET-) based MSUM devices in accordance with the present disclosure may be designed to achieve different functionality, dependent on intrinsic dielectric stack characteristics of a design, by adding or subtracting dielectrics in the dielectric stack. MSUM technology may be seamlessly integrated with the CMOS logic technology, for example, unlike conventional memories, such as DRAM, that may have unique customized integration requirements. MSUMs may be differentiated by the attributes of their charge transport, charge storage, and charge retention (e.g., charge blocking) characteristics. For example, the intrinsic memory-cell attributes may be different in terms of programming speed, power, and refresh requirements that may result in cycle-time variations, variations in data throughput and system capability, and differing applicability to replace conventional memories by functionality.

In some examples, some MSUM memory cells in accordance with the present disclosure may have a programming peak field lower than 8MV/cm, which may be significantly lower than that for conventional NVMs. Consequently, in some examples, memory durability (e.g., programming endurance) could match those of volatile SRAM and DRAM memories, thereby enabling functional replacements of volatile memories in digital systems not currently feasible by conventional NROMs and NAND flash based SSDs.

Some DRAMs may operate at 1.5 Volts, and may need to be refreshed about every 10 milliseconds. However, some MSUMs in accordance with the present disclosure may need to be refreshed (e.g., reprogrammed) only about every 10 seconds. Further, some DRAM memory cells, for instance, may require twice as much area as some MSUMs in accordance with the present disclosure.

In various examples of the present disclosure, MSUM-memory-cell fabrication may be compatible with complementary-metal-oxide-semiconductor (CMOS) fabrication techniques. This may allow, for example, the dielectric stack to be fabricated to a desired memory level (L2, L3, L4, or L5) with a minimal number of additional processing steps. Moreover, the MSUM memory cells may be scalable to about a five-nanometer feature size. For example, such scaling may be difficult for conventional DRAM designs.

MSUM memory cells in accordance with the present disclosure may be implemented (e.g., in scaled silicon) using, for example, CMOS logic technology and a set of unified and complimentary integration schemes that may eliminate some separate, custom-integration technology practices, such as those currently employed for DRAM (e.g., for L3), and NROM (for code, BIOS, etc.) and NAND-flash (e.g., for L4) memory chips. Additionally, custom interface logic and packaging may be required for communication between the processor and between different levels and technology-specific types of memories within the previous hierarchical memory systems. MSUM memory cells in accordance with the present disclosure may (e.g., only) add or subtract specific selected dielectrics (e.g., as thin films) in the gate stack design in a unified process integration methodology with the scaled CMOS logic technology to enable functionality equivalence from L2 through L5. This may potentially have, for example, multiple benefits, such as a) technology compatibility, b) productivity, c) enhancement in technology reliability, and d) reduction (e.g., elimination) of interfacing technology and packaging between different memory types and between logic and memories. For example, potential benefits at the system level may include not only process complexity reduction, but also, cost reduction, power reduction, and enhancements in performance, and reliability. Additional potential benefits may include a reduction in test cost and component product assurance cost both at a memory level and a system level, MSUMs in accordance with the present disclosure may allow for similar memory cell designs and array architectures throughout the memory hierarchy that may provide a spectrum of cycle time, latency targets, and data throughput to deliver varying functionality and durability requirements that might be balanced for certain applications. Due to the process commonality, MSUM-cell designs might be implemented in different capacity arrays and or subarrays within a single chip or multiple chips to address system cost, power, form-factor, performance, and durability objectives. This may provide more flexibility in system design, for example.

Some MSUM memory cell designs in accordance with the present disclosure, for example, may employ an energy-efficient direct tunneling mechanism to achieve desired system performance and functionality. Some MSUM memory cell designs in accordance with the present disclosure may extend the direct tunnel mechanism further through internal field enhancements using appropriately selected multi-layered direct tunneling dielectric films with progressive band-energy offsets coupled with multi-step direct tunneling. For example, this approach may allow additional voltage scalability with higher programming speed for the memory cells, and, consequently, power savings at the desired performance level, that may be difficult to achieve using conventional memories and hierarchical memory designs of comparable performance and applicability.

Band-engineered MSUM memory cells, for example, may employ stack design and tailored programming to establish targeted speed-retention tradeoffs towards achieving the system data-rate throughput (L2/L3/L4 functionality) for effective execution of functions. For example, this approach may reduce data transmission delays, and thus increase data availability, at appropriate processing nodes, reduce pre-fetch data storage requirements, reduce machine cycle time for execution of functions, reduce data refresh requirements, reduce complexity in bus design, etc.

MSUM memory cell designs in accordance with the present disclosure may provide, for example, unique sets of functional attributes via dielectric stack designs for FET based charge-trap memory cells. For example, the MSUM memory cell and array design may have the potential to create superior digital systems with flexible design attributes within the framework of a unified technology and memory cell and array designs and yet with versatile functionality to broaden application base not cost-effective with current conventional approaches.

MSUM memory cell designs in accordance with the present disclosure may provide, for example, unique memory sub-arrays, arrays, and/or sub-systems with specific attributes within the framework of a unified scaled CMOS technology, by incorporating or eliminating certain dielectric layers in the gate stack design of the memory cell. Such versatility may not be available in conventional memory cell and array designs. These attributes may include, for example, 1) cost optimized MSUM designs for L2/L3/L4, 2) power optimized MSUM designs for L2/L3/L4, 3) cost and performance optimized MSUM designs for L1/L2/L3/L4, 4) performance optimized (e.g., high performance) MSUM designs for L1/L2/L3/L4, and 5) capacity optimized (e.g., MLS) MSUM designs for L1/L2/L3/L4, plus MLC.

Figure 2A:
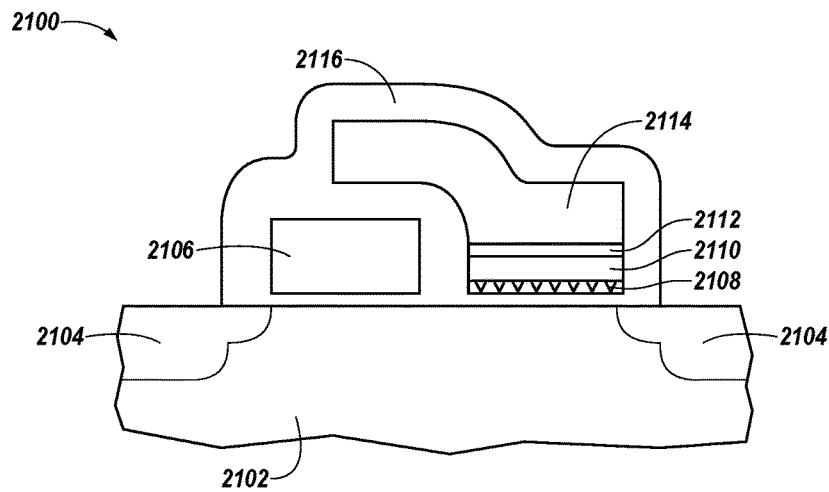
FIG. 2A illustrates a schematic of an NROM memory cell for implementation in a multifunctional memory cell in accordance with an embodiment of the present disclosure.
Figure 2B:
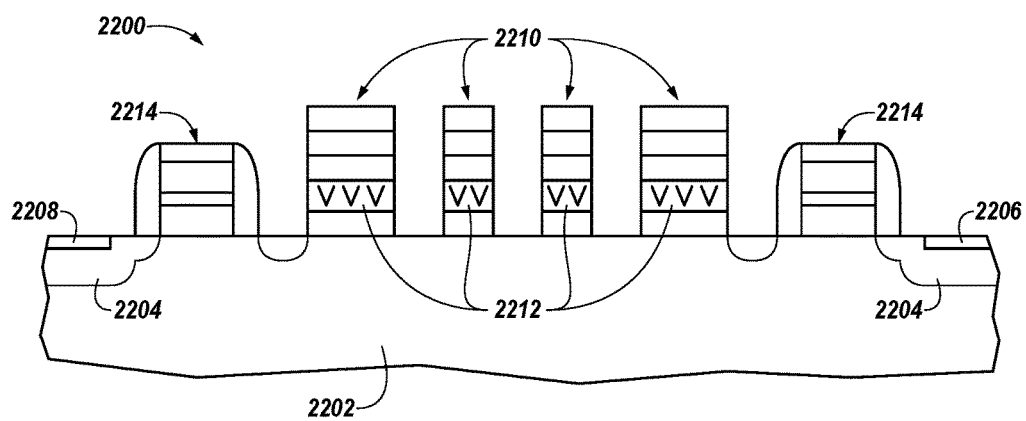
FIG. 2B illustrates a schematic of NAND memory cells for implementation in a multifunctional memory cell in accordance with an embodiment of the present disclosure.

FIG. 2A illustrates a schematic of an NROM memory cell 2100 for implementation in a multifunctional memory cell in accordance with an embodiment of the present disclosure. FIG. 2B illustrates a schematic of NAND memory cells 2210 for implementation in a multifunctional memory cell in accordance with an embodiment of the present disclosure.

As previously described herein, MSUM cells in accordance with the present disclosure can be implemented in the form of either 1) a two-transistor NROM cell with one fixed Vt transistor in series with an NV-transistor with MSUM characteristics sharing a common diffusion mode, or 2) a split gate (or split channel) implementation of the memory cell of form 1 whereby the fixed Vt element acts as the access gate and is integrated with the variable Vt NVM element which acts the control gate. Together the access gate and control gate can control the channel and set the memory thresholds or the memory states. For instance, the access gate can be designed to set the erase state for the memory cell and perform "over-erasure" protection for the memory, and the control gate can be programmed to define the programmed (e.g., written) states for the cell (e.g., "1" for 1 bit binary state, "01, 10, 11" for a DLC providing 2-bits per cell storage, "001, 010, 100, 110, 101, 011, 111" for a TLC providing 3-bits per cell storage, etc.). The integrated two device memory cell may be referred to herein as a 1.5 T NVM cell.

A schematic of an example configuration of such a cell is illustrated in FIG. 2A. The type of NROM cell illustrated in FIG. 2A can be used for MLC-NROMs because it can provide over-erasure protection and consequently tight distribution of the erase memory state (e.g., "0", "00", or "000" for 1 bit, 2 bit, or 3 bit storage, respectively) for the memory array.

As shown in FIG. 2A, NROM cell 2100 may be adjacent to (e.g., over) a semiconductor 2102, such as P-type (e.g., P$^-$-doped) silicon substrate. Source/drains 2104 (e.g., n$^+$-type or n$^-$-type diffusion regions) may be in semiconductor 2102. NROM cell 2100 can include a split gate structure (e.g., access gate element 2106 and overlapping control gate element 2114), and a stack having a charge storage (e.g., trap) element 2108, charge blocking element 2110, and an interface metallic layer 2112, as illustrated in FIG. 2A. Examples of the gate, charge storage element, charge blocking element, and interface layer will be further described herein.

FIG. 2B illustrates a schematic representation of a planar NAND memory string 2200, which can be used for high capacity storage. For example, as many as 256 bits could be serially stored within such a NAND string where the bits are accessed serially. The NAND string can provide the highest memory density for all memory cells, at the expense of performance since the memory cells need to be accessed serially within each string.

As shown in FIG. 2B, NAND string 2200 can include a number of NAND cells 2210 adjacent to (e.g., over) a semiconductor 2202, such as P-type (e.g., P$^-$-doped) silicon substrate. Source/drains 2204 (e.g., n$^+$-type diffusion regions) may be in semiconductor 2102 to form source line 2206 and bit line 2208, respectively. As illustrated in FIG. 2B, each respective NAND cell 2210 can include a stack comprising, among other elements, a charge storage (e.g., trap) element 2212, examples of which will be further described herein. Further, NAND string 2200 can include a bit-line select gate 2214 (to select the specific NAND string) on one end and a source-line select gate 2214 at the other end adjacent to source/drains 2204, as illustrated in FIG. 2B.

Embodiments of the present disclosure, however, are not limited to the specific designs illustrated in FIGS. 2A and 2B. Rather, MSUM concepts in accordance with the present disclosure could be applicable to all types of memory cells previously described herein by incorporating their unique stack designs to provide simultaneous multi-functionality. Further, as previously described herein, all MSUM cells described herein are implementable with common scaled CMOS technology.

In all MSUM cell designs to be described herein, tantalum nitride (TaN) may be used as the metallic interface to the gate to partially control the threshold of the device. Further, in all SUM designs, the equivalent oxide thickness (EOT) of the logic FETs (both PFET and NFET) may be set by the interface dielectric at the substrate end and the final blocking element of the SUM stack at the metal end. The intermetallic TaN material may be chosen to set the work-function for the logic FETs as well as the MSUM devices, and may be common to both logic and memory devices for all cases.

In all MSUM cell designs to be described herein, the simultaneous multi-functionality may be adjusted and simultaneously, the program performance (e.g., cycle) time could be adjusted by optimizing the programming pulse scheme. Although the stack designs described herein may be either cost-focused, power-focused, capacity-focused, performance-focused, or cost/performance-focused designs, the attributes of the designs could be altered and tailored for specific applications by altering the thickness of particular elements (e.g., layers) shown, eliminating particular elements, and/or adding additional (e.g., optional) layers for tunneling, trapping, and/or blocking functions.

Further, MSUM cell designs described herein may include a less non-volatile charge storage element, and a non-volatile charge storage element. As used herein, a "less non-volatile" charge storage element of the multifunctional cell can be a charge storage element that has a functionality level that is lower than the functionality level of the volatile charge storage element of the cell. For example, the less non-volatile charge storage element may have volatile level functionality, and as such may also be referred to as a volatile charge storage element.

Figure 3:
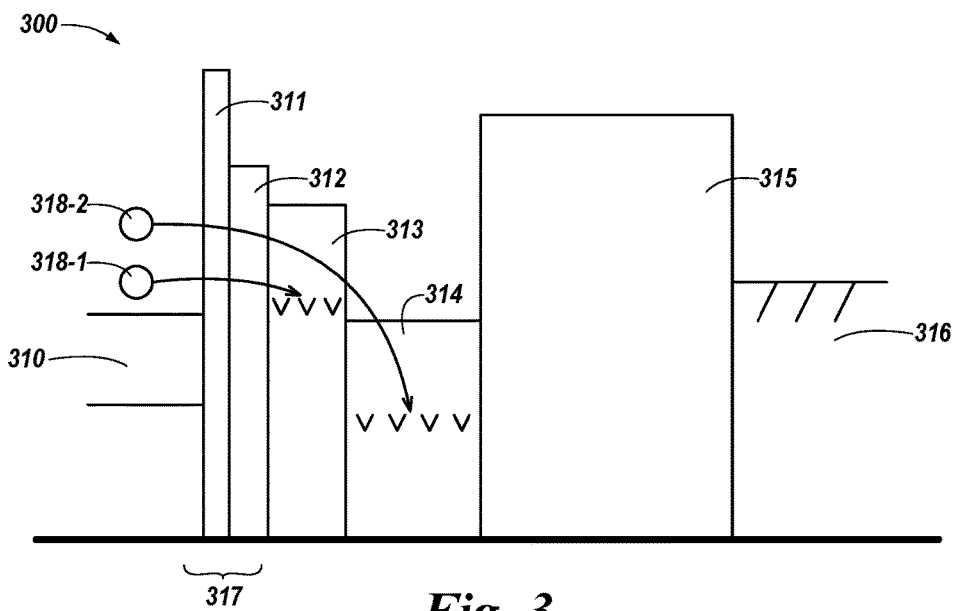
FIG. 3 illustrates a portion of a multifunctional memory cell in accordance with an embodiment of the present disclosure.

FIG. 3 illustrates a portion of a multifunctional memory cell 300 in accordance with an embodiment of the present disclosure, designed for lower cost, higher performance, lower power L2 and L3 functionality, with optional simultaneous extendibility to L4 functionality. For example, FIG. 3 illustrates a partial energy band diagram of the gate stack structure of multifunctional memory cell 300. Cell 300 can be, for instance, a five dielectric layer low cost, high performance memory cell that can provide L2 and L3 functionality while being cheap and/or easy to process (e.g., fabricate). In an embodiment, cell 300 can comprise a stack that includes a charge transport (e.g., tunnel) element having an oxygen-rich silicon oxynitride (OR—SiON) material and a hafnium dioxide (HfO$_2$) material (e.g., layer), a silicon oxynitride (Si$_2$ON$_2$) less non-volatile charge storage element, a gallium nitride (GaN) non-volatile charge storage element, and a hafnium lanthanum oxynitride (HfLaON) charge blocking element, as will be described herein.

As shown in FIG. 3, cell 300 can include a substrate element 310, a charge transport (e.g., tunneling) element 317 adjacent (e.g., in direct contact with) substrate element 310, a less non-volatile charge storage (e.g., trapping) element 313 adjacent charge transport element 317, a non-volatile charge storage element 314 adjacent volatile charge storage element 313, a charge blocking element 315 adjacent non-volatile charge storage element 314, and a gate element 316 adjacent charge blocking element 315. Substrate element 310 can be, for example, a silicon material (e.g., a silicon substrate), and gate element 316 can be an insulator-metal interface material (e.g., layer) such as, for instance, tantalum nitride (TaN) or titanium nitride (TiN).

Less non-volatile (e.g., DRAM) charge storage element 313 can be a silicon oxynitride of a specific composition ($Si_2ON_2$) material, which can provide stability and a large retention window. Non-volatile (e.g., flash) charge storage element 314 can be a gallium nitride (GaN) material, which can have a negative conduction offset band with respect to silicon and provide a high trapping density (e.g., greater than $10^{13}$ per square centimeter). Further, in some examples, non-volatile charge storage element 314 may also include a silicon-rich nitride material, such as, for instance, an injector silicon-rich nitride material (not shown in FIG. 3) to further enhance charge storage.

Charge blocking element 315 can be a thermally stable, low leakage hafnium oxynitride material, such as a hafnium lanthanum oxynitride (HfLaON) material, a hafnium aluminum oxynitride (HfAlON) material, a hafnium tantalum oxynitride (HfTaON) material, or a hafnium silicon oxynitride (HfSiON) material, for instance. Such a material can be a trap free dielectric that has low conductivity and a high-K value that can result in a low equivalent oxide thickness (EOT). Further, such a material can have high thermal and structural stability, high breakdown strength, and can be compatible with the metallic interface of gate element 316.

In the example illustrated in FIG. 3, charge transport element 317 includes a first material (e.g., first layer) 311, and a second material (e.g., second layer) 312. First material 311 can be an oxygen-rich silicon oxynitride material that can provide interface stability with substrate element 310, and second material 312 can be a hafnium dioxide ($HfO_2$) material. As an example, oxygen-rich silicon oxynitride material can be a high-K material having a composition of N/N+O of approximately 0.18 and an atomic concentration of oxygen in the range of 50-60%, and can be fabricated using low-pressure chemical vapor deposition, atomic layer deposition, or thermal/plasma oxidation/nitridation techniques, for instance. Utilizing such materials for first material 311 and second material 312 can increase the speed and efficiency of charge transport through charge transport element 317 during program and/or erase operations (e.g., while an external field exists), while maintaining a low conductivity to prevent reverse transport of charge stored by charge storage elements 313 and/or 314 back through charge transport element 317 (e.g., when the external field is removed). The transport of charge through charge transport element 317 will be further described herein.

First material 311 and second material 312 can have thicknesses of 1 nanometer (nm) and 3 nm, respectively, and charge transport element 317 can have an EOT of approximately 1.2 nm. Further, less non-volatile charge storage element 313 and non-volatile charge storage element 314 can have thicknesses of 2 nm and 3 nm, respectively, and a combined EOT of approximately 1.3 nm. Further, charge blocking element 315 can have a thickness of 6 nm, and an EOT of approximately 2.0 nm. The combined total thickness and EOT for the stack comprising charge transport element 317, volatile and non-volatile charge storage elements 313 and 314, and charge blocking element 315 can be, for instance, approximately 15 nm and approximately 4-5 nm, respectively. This embodiment can be a low power (e.g., less than or equal to 5 V) design with high performance, as previously described.

During operation of cell 300, such as, for instance, during a program operation being performed on cell 300, a charge, such as, for instance, an electron, may be transported from substrate element 310 through charge transport element 317 (e.g., through first material 311 and second material 312) to either less non-volatile charge storage element 313 or non-volatile charge storage element 314. For instance, in the example illustrated in FIG. 3, a first charge 318-1 is being transported through charge transport element 317 to less non-volatile charge storage element 313, and a second charge 318-2 is being transported through charge transport element 317 to non-volatile storage element 314. In some examples, charges 318-1 and 318-2 can be simultaneously transported through charge transport element 317, and in some examples charges 318-1 and 318-2 can be separately (e.g., at different times) transported through charge transport element 317.

As an example, a program operation performed on cell 300 can include applying a program (e.g., write) voltage to cell 300, and whether the charge is transported to less non-volatile charge storage element 313 or non-volatile charge storage element 314 during the program operation may depend on the duration for which the program voltage is applied to the cell. For instance, a program voltage of ≤+/−5 volts (V) applied to the cell for ≤5 nanoseconds (ns) may result in the charge being transported to less non-volatile charge storage element 313, while a program voltage of +/−≤5 V applied to the cell for ≥20 ns may result in the charge being transported to non-volatile charge storage element 314. Such low program voltage and durations may result in program operations performed on cell 300 consuming less power than program operations performed on previous memory cells. When the pulse duration is extended to 100 ns or longer, more charges may be stored in storage element 314, and may remain stored for an extended period of time to provide either extended L3 or L4 functionality. To achieve L4 functionality, the thickness of charge blocking element 315 could be increased, and pulsing conditions could be optimized to achieve longer retention and larger memory window.

The charge (e.g., charges 318-1 and/or 318-2) may be transported through charge transport element 317 by, for instance, direct tunneling through charge transport element 317. For example, charge transport element 317 can be a double layer progressive band offset (PBO) tunnel barrier that can provide internal field-aided enhanced electron transport, and the charge may tunnel through the PBO tunnel barrier via direct electron tunneling.

The charge can then be trapped and stored by the charge storage element to which it has been transported. For instance, in the example illustrated in FIG. 3, charge 318-1 is being trapped and stored by less non-volatile charge storage element 313, and charge 318-2 is being trapped and stored by non-volatile charge storage element 314.

Charge blocking element 315 can prevent the stored charge from leaking while it is being stored. For instance, in the example illustrated in FIG. 3, charge blocking element 315 can prevent leakage of charge 318-1 stored by volatile charge storage element 313, and charge blocking element 315 can prevent leakage of charge 318-2 stored by non-volatile charge storage element 314.

Figure 4:
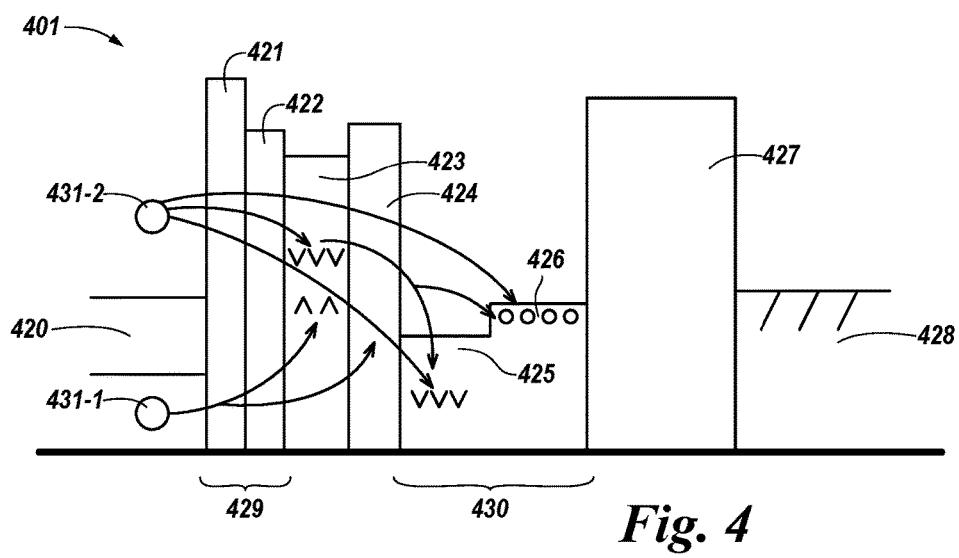
FIG. 4 illustrates a portion of a multifunctional memory cell in accordance with an embodiment of the present disclosure.

FIG. 4 illustrates a portion of a multifunctional memory cell 401 in accordance with an embodiment of the present disclosure, designed for storage capacity and enhanced erasing capability with relatively higher performance for L2-L3 functionality, which can be achieved by incorporating two additional materials (e.g., layers) in the stack design-one for enhanced hole tunneling (e.g., material 424), and another for enhanced charge storage (e.g., material 426). For example, FIG. 4 illustrates a partial energy band diagram of multifunctional memory cell 401. Cell 401 can be, for instance, a low cost, high capacity memory cell that can provide both L2-L3 functionality and L4 functionality, including, for instance, working memory and/or large capacity file storage, while being cheap and/or easy to process (e.g., fabricate). In an embodiment, cell 401 can comprise a stack that includes a charge transport element having an OR—SiON material and an HfLaON material, an $Si_2ON_2$ less non-volatile charge storage element, an additional lanthanum oxide ($La_2O_3$) charge transport element to enable field-enhanced hole transport during erasing, a non-volatile charge storage element having a GaN material and an injector silicon-rich nitride (i-SRN) material for extended charge storage, and an HfLaON charge blocking element, as will be described herein.

As shown in FIG. 4, cell 401 can include a substrate element 420, a charge transport element 429 adjacent (e.g., in direct contact with) substrate element 420, a less non-volatile charge storage element 423 adjacent charge transport element 429, an additional charge transport element 424 adjacent element 423, a non-volatile charge storage element 425 in combination with extended charge storage material 426 together comprising element 430 adjacent element 424, a charge blocking element 427 adjacent non-volatile charge storage element 430, and a gate element 428 adjacent charge blocking element 427. Substrate element 420 can be, for example, a silicon material, and gate element 428 can be an insulator-metal interface material such as, for instance, TaN or TiN.

In an embodiment, less non-volatile (e.g., DRAM) charge storage element 423 can be a $Si_2ON_2$ material, which can provide stability and a large retention window. In an additional embodiment, less non-volatile charge storage element 423 can be a silicon nitride ($Si_3N_4$) material, which can have a shallow trap depth to enhance detrapping and increase the speed of erase operations performed on cell 401.

In the example illustrated in FIG. 4, non-volatile (e.g., flash) charge storage element 430 includes a first non-volatile charge storage material 425, and a second non-volatile charge storage material 426. First material 425 can be a GaN material, which can have a negative conduction offset band with respect to silicon and provide a high trapping density, and second material 426 can be a silicon-rich nitride material, such as, for instance, an injector silicon-rich nitride material, to further enhance charge storage (e.g., the memory window) for the flash memory functionality.

Charge blocking element 427 can be a thermally stable, low leakage hafnium oxynitride material, such as a HfLaON material, a HfAlON material, a HfTaON material, or a HfSiON material, for instance. Such a material can have benefits analogous to those previously described for charge blocking element 316 in connection with FIG. 3.

In the example illustrated in FIG. 4, charge transport element 429 includes a first material 421, and a second material 422. As illustrated in FIG. 4, memory cell 401 (e.g., charge transport element 429) may also include a third material 424 between (e.g., in direct contact with) less non-volatile charge storage element 423 and non-volatile charge storage element 430.

First material 421 can be an oxygen-rich silicon oxynitride material that can provide interface stability with substrate element 420. For instance, the oxygen-rich silicon oxynitride material can be a high-K material having a composition and fabrication analogous to that previously described for first material 311 of charge transport element 317 in connection with FIG. 3. In an embodiment (e.g., the embodiment in which less non-volatile charge storage element 423 is a $Si_2ON_2$ material), second material 422 can be a hafnium oxynitride material (e.g., HfLaON) and third material 424 can be an $HfO_2$ material. In an additional embodiment (e.g., the embodiment in which volatile charge storage element 423 is a $Si_3N_4$ material), second material 422 and third material 424 can be a lanthanum oxide ($La_2O_3$) material to enhance both electron and hole tunneling, providing lower band offset for hole tunneling.

Utilizing such materials for first material 421, second material 422, and third material 424 can have benefits analogous to those previously described for charge transport element 317 in connection with FIG. 3. Additionally, utilizing $La_2O_3$ for second and/or third materials 422 and 424, respectively, can allow for both electron and hole tunneling, which can further increase the speed and efficiency of charge transport through charge transport element 429 during program and/or erase operations. Further, utilizing such materials for charge transport element 429, less non-volatile storage element 423, and non-volatile storage element 430 can make cell 401 cheap and/or easy to process, while providing multifunctional capability and enhanced charge storage capacity simultaneously.

First material 421, second material 422, and third material 424 can have thicknesses of 1 nm, 2 nm, and 3 nm, respectively, and charge transport element 429 can have an EOT of approximately 1.7 nm. Further, less non-volatile charge storage element 423 and non-volatile charge storage element 430 can have thicknesses of 2 nm and 5 nm, respectively, and a combined EOT of approximately 3.1 nm. Further, charge blocking element 427 can have a thickness of 6-10 nm, and an EOT of approximately 2.0-2.5 nm. The combined total thickness and EOT for the stack comprising charge transport element 429, volatile and non-volatile charge storage elements 423 and 430, and charge blocking element 427 can be, for instance approximately 26 nm and approximately 8 nm, respectively.

During operation of cell 401, such as, for instance, during a program operation being performed on cell 401, a charge (e.g., an electron) may be transported from substrate element 420 through charge transport element 429 (e.g., through first material 421, second material 422, and/or third material 424) by enhanced direct tunneling (e.g., PBO DTM) to either less non-volatile charge storage element 423 or non-volatile charge storage element 430. For instance, in the example illustrated in FIG. 4, a first charge 431-1 is being transported through charge transport element 429 to less non-volatile charge storage element 423, and a second charge 431-2 is being transported through charge transport element 429 (e.g., including through third element 424) to non-volatile storage element 430 (e.g., to first non-volatile charge storage material 425). In some examples, charges 431-1 and 432-2 can be simultaneously transported through charge transport element 429, and in some examples charges 431-1 and 432-2 can be separately (e.g., at different times) transported through charge transport element 429. When the gate polarity is reverses for erasing, enhanced hole tunneling from element 430 may take place through the above-mentioned direct tunnel (PBO-DTM for holes) barriers transporting holes to both the less non-volatile charge storage element 423 and the non-volatile charge storage element 430. Simultaneously, electrons from less non-volatile charge storage element 423 and the non-volatile charge storage element 430 may be detrapped, and either get compensated with incoming holes or tunnel back to silicon substrate 420. This may significantly reduce erase time and cycle time, enhancing performance.

As an example, a program operation performed on cell 401 can include applying a program (e.g., write) voltage to cell 401, and whether the charge is transported to volatile charge storage element 423 or non-volatile charge storage element 430 during the program operation may depend on the duration for which the program voltage (for both write and erase, =/−Vpp) is applied to the cell. For instance, a program voltage of +/−7 V applied to the cell for 10 ns to 100 ns may result in the charge being transported to volatile charge storage element 423 to enable L2 and/or L3 functionality, while a program voltage of +/−7 V applied to the cell for 500 ns to 100 microseconds (μs) may result in the charge being transported to non-volatile charge storage element 430.

The charge (e.g., charges 431-1 and/or 432-2) may be transported through charge transport element 429 and 424 by, for instance, tunneling through charge transport element 429. For example, charge transport element 429 (e.g., including third material 424) can be a double tunnel, triple layer PBO tunnel barrier that can provide internal field-aided enhanced electron transport, and the charge may tunnel through the PBO tunnel barrier via direct electron tunneling or hole tunneling.

The charge can then be trapped and stored by the charge storage element to which it has been transported. For instance, in the example illustrated in FIG. 4, charge 431-1 is being trapped and stored by less non-volatile charge storage element 423, and charge 431-2 is being trapped and stored by non-volatile charge storage element 430. Charge blocking element 428 can prevent the stored charge from leaking while it is being stored, in a manner analogous to charge blocking element 315 previously described in connection with FIG. 3.

Figure 5:
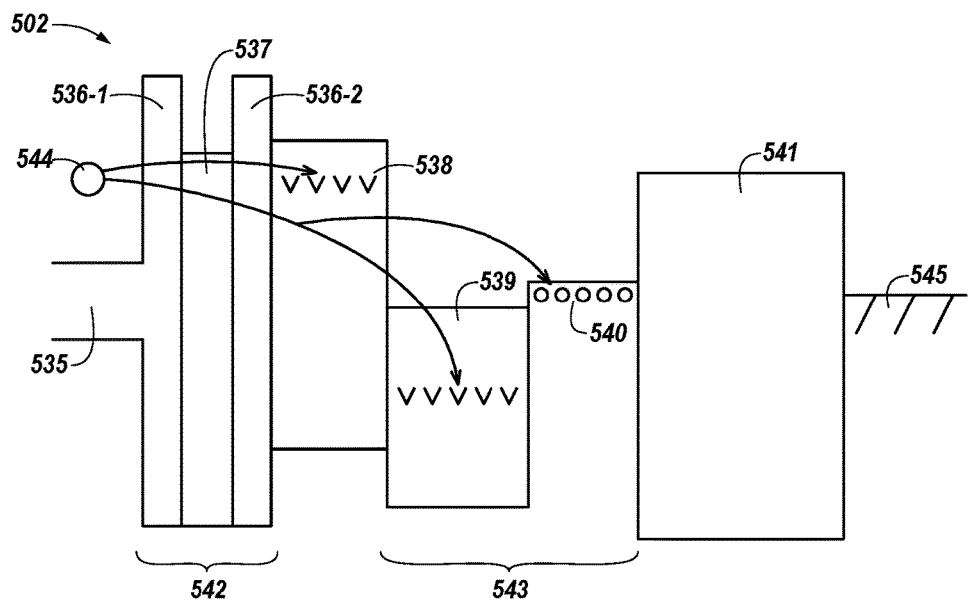
FIG. 5 illustrates a portion of a multifunctional memory cell in accordance with an embodiment of the present disclosure.

FIG. 5 illustrates a portion of a multifunctional memory cell 502 in accordance with an embodiment of the present disclosure, describing a seven layer stack design with all nitride and oxynitride dielectric materials to provide fabrication ease and process compatibility, while focused on simultaneous L3 and MLS L4 functionality with extended L3 refresh time for power saving. For example, FIG. 5 illustrates a partial energy band diagram of multifunctional memory cell 502. Cell 502 can be a high capacity cell with an extended refresh, and can provide both L3 and L4-MLS functionality, for example. In an embodiment, cell 502 can comprise a stack that includes a charge transport element having an HfTaON material between two OR—SiON materials, a nitride less non-volatile charge storage element, a non-volatile charge storage element having a GaN material and an i-SRN material, and an HfTaON charge blocking element, as will be described herein. Since all materials are either nitride or in the oxynitride family of higher K dielectric films that can be deposited by the same or similar tool with processing technology, the process complexity and cost can be reduced.

As shown in FIG. 5, cell 502 can include a substrate element 525, a charge transport element 542 adjacent (e.g., in direct contact with) substrate element 535, a less non-volatile charge storage element 538 adjacent charge transport element 542, a non-volatile charge storage element 539 combined with a charge storage element 540 together comprising element 543, a charge blocking element 541 adjacent the non-volatile charge storage element 543, and a gate element 545 adjacent charge blocking element 541. Substrate element 535 can be, for example, a silicon material, and gate element 545 can be an insulator-metal interface material such as, for instance, TaN or TiN. Charge blocking element 541 can be a thermally stable, low leakage hafnium oxynitride material (e.g., HfLaON, HfAlON, HfTaON, or HfSiON) with benefits analogous to those previously described for charge blocking element 316 in connection with FIG. 3.

Less non-olatile (e.g., DRAM) charge storage element 538 can be a nitride material, which can provide stability and a large retention window, thereby providing an extended refresh capability being adjacent to the triple-layer VARIOT barrier 542 at the expense of somewhat slower performing L3. Non-volatile (e.g., NROM) charge storage element 543 can include a first non-volatile charge trapping material 539, and a second charge storage material 540. First material 539 can be a GaN material, which can have a negative conduction offset band with respect to silicon and provide greater trap depth and a high trapping density, and second material 540 can be a silicon-rich nitride material, such as, for instance, an injector silicon-rich nitride material, to further enhance charge storage (e.g., the memory window) for the flash memory L4 functionality.

In the example illustrated in FIG. 5, charge transport element 542 includes a first material 536-1, a second material 536-2, and a third material 537 between materials 536-1 and 536-2 forming a three-layer direct tunnel VARIOT barrier. First material 536-1 and second material 536-2 can both be a high-K oxygen-rich silicon oxynitride material having a composition and fabrication analogous to that previously described for first material 311 of charge transport element 317 in connection with FIG. 3. Third material 537 can be an HfTaON material. Further, first material 536-1, second material 536-2, and third material 537 can each be ultra-thin (e.g., 1 nm thick) materials.

Utilizing such materials for first material 536-1, second material 536-2, and third material 537 in charge transport element 542 can have benefits analogous to those previously described for charge transport element 317 in connection with FIG. 3. Additionally, utilizing such materials in charge transport element 542 can provide barrier thinning, which can further increase the speed and efficiency of charge transport (e.g., electron fluence) through charge transport element 542 during program and/or erase operations.

During operation of cell 502, such as, for instance, during a program operation being performed on cell 502, a charge (e.g., electron) 544 may be transported from substrate element 535 through charge transport element 542 (e.g., through first material 536-1, third material 537, and second material 536-2) to either less non-volatile charge storage element 538 or non-volatile charge storage element 543 (e.g., first non-volatile charge storage material 539), as illustrated in FIG. 5. The charge 544 may be transported through charge transport element 542 by, for instance, direct tunneling through the triple-layer charge transport element 542.

For example, charge transport element 542 can be a variable oxide thickness (VARIOT) tunnel barrier that can provide simultaneously barrier thinning and lower reverse tunneling, and the charge may tunnel through the VARIOT tunnel barrier using only single carrier electron transport, with the high hole barrier of materials 536-1, 536-2, and 537 preventing hole tunneling from substrate 535. Further, charge transport element 542 can provide internal field-aided enhanced electron transport, as the charge may gain internal field along the conduction band of third material 537 during the program operation. At the same time, the high energy barrier presented by material 536-2 may reduce the reverse tunneling of charges trapped in elements 538 and 539. As such, while the effective tunnel distance for the charge may be equal to the thickness of first material 536-1 during programming, the effective tunneling distance for charges trapped in element 538 would be equal to the entire physical thickness of charge transport element 542, thereby reducing charge loss and extending the refresh time for L3 functionality during standby.

The charge can then be trapped and stored by the charge storage element (e.g., charge storage element 538 or 543) to which it has been transported. For instance, in the example illustrated in FIG. 5, charge trapping may occur at two different energy levels corresponding to two different tunneling distances (e.g., the distance to less non-volatile charge storage element 538 and the distance to non-volatile charge storage element 543) are provided, which can allow both the speed of charge transport for trapping, and/or length of time for which the charge is being trapped and stored, to be varied. Charge blocking element 541 can prevent the stored charge from leaking to the gate while it is being stored, in a manner analogous to charge blocking element 315 previously described in connection with FIG. 3.

First material 536-1 and second material 536-2 can both have thicknesses of 1 nm each, with the second material being around 2 nm, and consequently, charge transport element 542 may have a physical thickness of 4 nm with EOT of approximately 2 nm. Further, less non-volatile charge storage element 538 and non-volatile charge storage element 539 can have thicknesses of 3 nm and 5 nm, respectively, with the material 540 being 4 nm thick. The combined EOT of the trapping and storage layers could be approximately 5 nm, with the physical thickness being 12 nm. Further, charge blocking element 541 can have a thickness of 7-9 nm, and an EOT of approximately 2.0 nm. The combined total thickness and EOT for the stack can be, for instance approximately 25 nm and approximately 9 nm, respectively.

The stack can be designed to operate at +/−Vpp of 7 V, focused to provide a relatively slower L3 functionality with extended refresh for L3 and consequently lower programming power. It can also provide simultaneously high capacity low cost L4 functionality with MLC capability, with 3 bit/cell L4 capacity. Further, it can provide low processing complexity in stack fabrication and technology integration. The L3 performance can be around 50-100 ns, and the L4 performance can be around 1000 ns for TLC storage.

Figure 6:
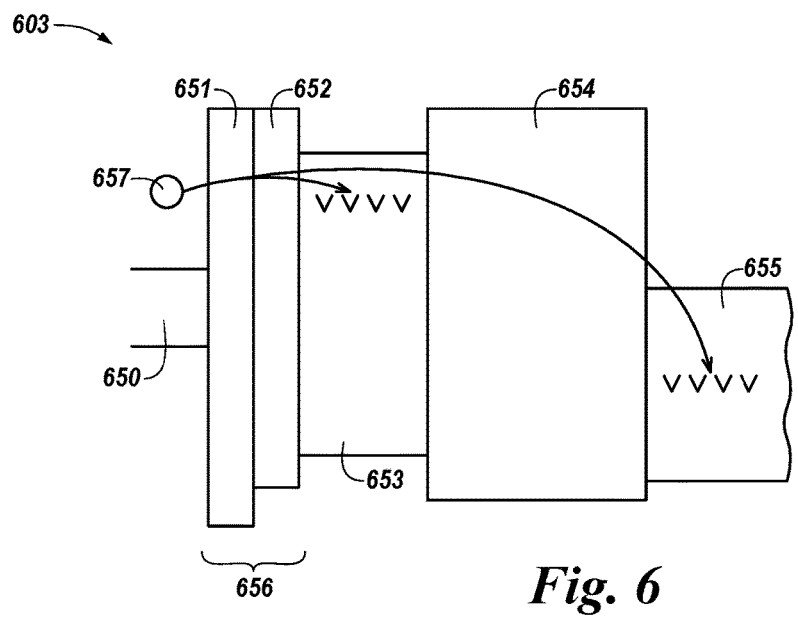
FIG. 6 illustrates a portion of a multifunctional memory cell in accordance with an embodiment of the present disclosure.

FIG. 6 illustrates a portion of a multifunctional memory cell 603 in accordance with an embodiment of the present disclosure. The cell illustrated in FIG. 6 can be analogous to the example previously described in connection with FIG. 5, in that it describes a seven-layer stack design with all nitride and oxynitride dielectric materials to provide fabrication ease and process compatibility, while focused on simultaneous L2-L3 and MLS L4 functionality suitable for lower cost NAND flash application and integration. Cell 603 can be a low cost, higher (e.g., L2, L3) performance memory cell that can provide L2-L3 functionality but relatively slower L4 functionality compared to the cell described in connection with FIG. 5, while being easier to process (e.g., fabricate) and providing higher yield and reliability. In an embodiment, cell 603 can comprise a stack that includes a charge transport element having an OR—SiON material and an HfSiON material, an nitride volatile charge storage element, an additional HfSiON charge transport element, a non-volatile charge storage element having a GaN material and an i-SRN material, and an HfSiON charge blocking element, as will be described herein. Since all materials are either nitride or of the oxynitride family of higher K dielectric films which can be deposited by the same or similar tools with convention processing technology, process complexity and cost can be reduced.

As shown in FIG. 6, cell 603 can include a substrate element 650, a charge transport element 656 adjacent (e.g., in direct contact with) substrate element 650, a volatile charge storage element 653 adjacent charge transport element 656, and a non-volatile charge storage element 655. Substrate element 650 can be, for example, a silicon material. Further, although not shown in FIG. 6, cell 603 can also include a charge blocking element adjacent non-volatile charge storage element 655, and a gate element adjacent the charge blocking element. The charge blocking element and gate element can be analogous to charge blocking element 315 and gate element 316, respectively, previously described in connection with FIG. 3.

In the example illustrated in FIG. 6, volatile (e.g., DRAM) charge storage element 653 can be a nitride material, such as, for instance, a $Si_3N_4$ material, which can have a shallow trap depth to enhance detrapping and increase the speed of erase operations performed on cell 603. Non-volatile (e.g., NROM) charge storage element 653 can be a GaN material, which can have a negative conduction offset band with respect to silicon and provide a high trapping density and longer retention.

In the example illustrated in FIG. 6, charge transport element 656 includes a first material 651, and a second material 652 forming a double-layer direct tunnel VARIOT barrier and providing for faster programming when compared with the example of FIG. 5. As illustrated in FIG. 6, memory cell 603 (e.g., charge transport element 656) may also include a third material 654 between (e.g., in direct contact with) less non-volatile charge storage element 653 and non-volatile charge storage element 655. In an embodiment, non-volatile charge storage element 655 may be deposited on top of third material 654. Further, although not shown in FIG. 6, charge transport element 653 may include optionally an $La_2O_3$ material between first material 651 and second material 652 to extend the refresh time for L2-L3. The tunnel material 654 can be placed between less non-volatile charge storage element 653 and non-volatile charge storage element 655 to extend the tunneling distance from silicon substrate 650, thereby reducing back-tunneling and enlarging the L4 memory window needed to provide MLC high capacity L4.

First material 651 can be a high-K oxygen-rich silicon oxynitride material having a composition and fabrication analogous to that previously described for first material 311 of charge transport element 317 in connection with FIG. 3. In an embodiment, second and third materials 652 and 654 can both be an HfSiON material. In an additional embodiment, second and third materials 652 and 654 can both be an HfLaON material, similar to the stack design described in connection with FIG. 5.

Utilizing such materials for first material 651, second material 652, and third material 654 can have benefits analogous to those previously described for charge transport element 317 in connection with FIG. 3. Additionally, the HfSiON or HfLaON material utilized for second material 652 and third material 654 may have a high K-value, and therefore the electrostatic field that may be caused by charge stored in the nitride material of less non-volatile charge storage element 653 may be lower as compared to that of a single oxygen-rich silicon oxynitride layer, which can reduce the rate of charge loss to substrate element 650.

First material 651 and second material 652 can be ultra-thin materials. For instance, first material 651 and second material 652 can have a thickness of about 1 nm to 1.5 nm. Third material 654 can be thicker than first and second materials 651 and 652. For instance, third material 654 can have a thickness of about 4 nm to 5 nm. Further, less non-volatile charge storage element 653 can have a thickness of 3 nm, and non-volatile charge storage element 655 can be thicker than element 653. Further, the charge blocking element of cell 603 can have a thickness of about 7 nm, and an EOT of approximately 2.0 nm. The total stack EOT can be about 8.5 nm, with a physical thickness of about 26 nm.

During operation of cell 603, such as, for instance, during a program operation being performed on cell 603, a charge (e.g., electron) 657 may be transported from substrate element 650 through charge transport element 656 (e.g., through first material 651, second material 652, and/or third material 654) to either less non-volatile charge storage element 653 or non-volatile charge storage element 655, as illustrated in FIG. 6. As an example, a program operation performed on cell 603 can include applying a program (e.g., write) voltage to cell 603, and whether the charge is transported to less non-volatile charge storage element 653 or non-volatile charge storage element 655 during the program operation may depend on the duration for which the program voltage is applied to the cell. For instance, a program voltage of +/−6.5-7.0 V applied to the cell for 100 nanoseconds (ns) may result in the charge being transported to less non-volatile charge storage element 653, while a program voltage of +/−6.5-7.0 V applied to the cell for 1 millisecond (ms) may result in the charge being transported to non-volatile charge storage element 655.

The charge 657 may be transported through charge transport element 656 by double layer VARIOT direct tunnel barrier 656, which can provide field-enhanced fast charge transport to volatile storage element 653 trapping centers, for instance, enabling L2-L3 functionality. Further, charge transport through element 654 may take place by modified Fowler-Nordheim (FN) tunneling, which is slower and requires a higher potential drop across element 654. During programming and erasing, hole transport from silicon substrate 650 may be prevented due to the high hole energy barrier of materials 651, 652, and 654. The stack design may be, therefore, comparatively slower for L4 functionality as compared with the examples of the previous figures.

Figure 7:
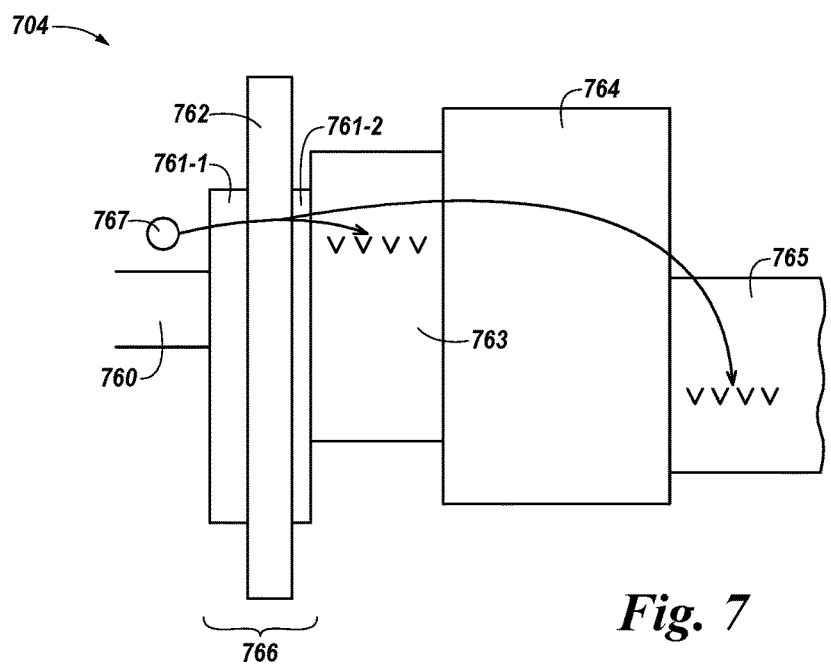
FIG. 7 illustrates a portion of a multifunctional memory cell in accordance with an embodiment of the present disclosure.
Figure 8:
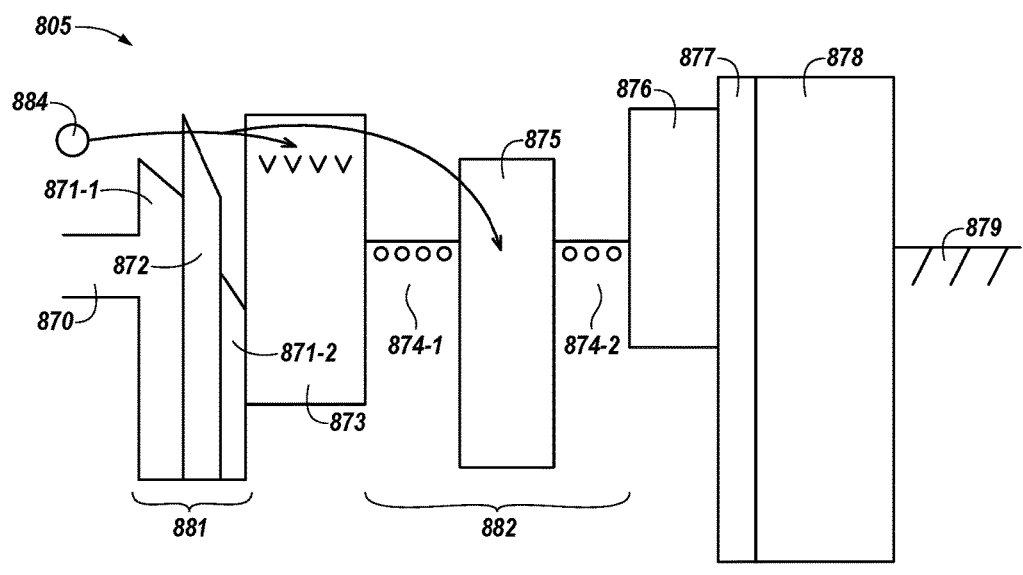
FIG. 8 illustrates a portion of a multifunctional memory cell in accordance with an embodiment of the present disclosure.
Figure 9:
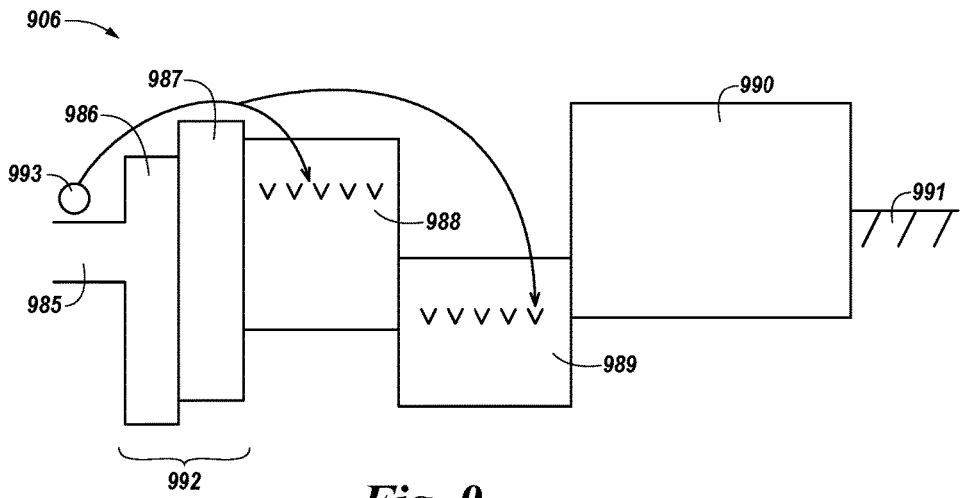
FIG. 9 illustrates a portion of a multifunctional memory cell in accordance with an embodiment of the present disclosure.
Figure 11:
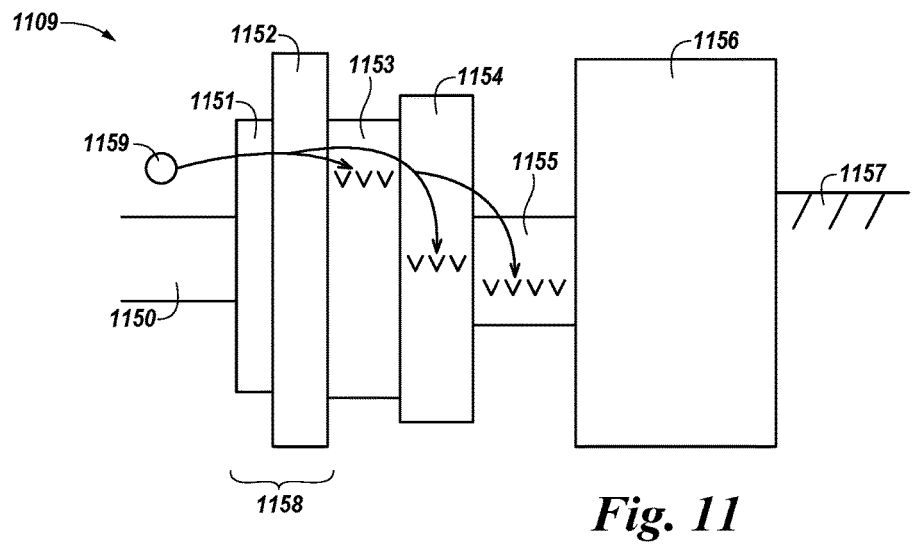
FIG. 11 illustrates a portion of a multifunctional memory cell in accordance with an embodiment of the present disclosure.

The next three cells illustrated in FIGS. 7-9, as well as the cell illustrated in FIG. 11, are based on the employment of a high K interface metal oxide dielectric with lower conduction band energy level for electron with reference to silicon substrate, but with higher valence band energy barrier for hole injection. An $HfO_2$ dielectric having reliability and low leakage and has been used for scaled FET devices for CMOS logic technology. In previous approaches, a stress-free composition of conventional silicon-oxynitride of composition $Si_2ON_2$ (atomic oxygen concentration of 20%) has been used in previous silicon technology applications as an interface dielectric with lower conduction band energy level for electron in MIS (metal-insulator-semiconductor) devices where higher electron injection may be desired. However, the dielectric constant of $Si_2ON_2$ is similar to nitride and significantly lower compared to that of $HfO_2$, which is 25. Use of $HfO_2$ at the silicon injecting interface to promote enhanced injection from silicon substrate during writing for NVM-FET design also requires a higher energy barrier for electron adjacent to $HfO_2$ to reduce reverse tunneling of electrons back to silicon when the writing pulse is removed from the gate. This can be achieved by employing a three-layer direct tunnel barrier comprising low-energy/high-energy/low-energy conduction band materials, where $HfO_2$ is the first direct tunnel layer at the silicon/insulator interface. This type of barrier is known as CRSETED barrier. Due to lower energy barrier at the silicon-insulator interface, electron injection could be readily achieved from silicon into the insulator stack at relatively lower voltage. CRESTED barrier, therefore, can allow lower power designs for MSUM devices in accordance with the present disclosure. The following illustrations of MSUM designs are based on +/−5V Vpp requirements for programming for all cases of memory cell designs. Crested barrier designs of NVM cells may have applicability in high capacity NAND-Flash and NOR-Flash memory designs to conserve power and where fast performance is not critical in applications.

FIG. 7 illustrates a portion of a multifunctional memory cell 704 in accordance with an embodiment of the present disclosure. For example, FIG. 7 illustrates a partial energy band diagram of multifunctional memory cell 704. Cell 704 can be a low power memory cell that can provide both L3 and L4-MLS functionality, while consuming a relatively low amount of power during operation (e.g., during program and/or erase operations performed on the cell). In an embodiment, cell 704 can comprise a stack that includes a charge transport element having an aluminum oxide ($Al_2O_3$) material or silicon dioxide ($SiO_2$) material or OR—SiON material between two $HfO_2$ materials, or optionally two hafnium aluminium oxide (HfAlO) materials, a nitride less non-volatile charge storage element, an additional HfSiON or HfLaON charge transport element to reduce charge loss to the silicon substrate and enhance the memory window for MLC capability, a GaN non-volatile charge storage element, and an HfLaON charge blocking element, as will be described herein. This allows for a standard seven-layer design. However, an additional layer of i-SRN may be adjacent to the GaN non-volatile charge storage element to further enhance the memory window for improved MLC capability.

As shown in FIG. 7, cell 704 can include a substrate element 760, a charge transport element 766 adjacent (e.g., in direct contact with) substrate element 760, a less non-volatile charge storage element 763 adjacent charge transport element 766, and a non-volatile charge storage element 765. Substrate element 760 can be, for example, a silicon material. Further, although not shown in FIG. 7, cell 704 can also include a charge blocking element adjacent non-volatile charge storage element 765, and a gate element adjacent the charge blocking element. The charge blocking element and gate element can be analogous to charge blocking element 315 and gate element 316, respectively, previously described in connection with FIG. 3.

In the example illustrated in FIG. 7, less non-volatile (e.g., DRAM) charge storage element 763 can be a nitride material, such as, for instance, a $Si_3N_4$ material, which can have a shallow trap depth to enhance detrapping and increase the speed of erase operations performed on cell 704. Non-volatile (e.g., NROM) charge storage element 765 can be a GaN material, which can have a negative conduction offset band with respect to silicon and provide a high trapping density with deeper traps.

In the example illustrated in FIG. 7, charge transport element 766 includes a first material 761-1, a second material 761-2, and a third material 762 between materials 761-1 and 761-2. As illustrated in FIG. 7, memory cell 704 (e.g., charge transport element 766) may also include a fourth material 764 between (e.g., in direct contact with) less non-volatile charge storage element 763 and non-volatile charge storage element 765. In an embodiment, non-volatile charge storage element 765 may be deposited on top of fourth material 764.

In an embodiment, first material 761-1 and second material 761-2 can both be an $HfO_2$ material, and in an additional embodiment, first material 761-1 and 761-2 can both be a hafnium aluminium oxide (HfAlO) material. Further, in an embodiment third material 762 can be an aluminum oxide ($Al_2O_3$) material, in an additional embodiment third material 762 can be a silicon dioxide ($SiO_2$) material, and in an additional embodiment third material 762 can be an oxygen-rich silicon oxynitride material. Further, in an embodiment, fourth material 764 can be an HfSiON material, and in an additional embodiment fourth material 764 can be an HfLaON material. Utilizing such materials for first material 761-1, second material 761-2, third material 762, and fourth material 764 can have benefits analogous to those previously described for charge transport element 656 in connection with FIG. 6, except that the CRESTED barrier design with high energy barrier associated with material 762 can effectively reduce electron charge leakage to the silicon substrate during standby retention state, and can extend the refresh time for L3 functionality as well as memory retention and the memory window for L4 MLC design at a lower power level.

First material 761-1 may have a thickness of 2.5 nm to insure a low interface state density design with the silicon substrate, and second material and third material 761-2 and 762 can also be in the same range of thickness to insure direct tunneling in those materials. The EOT for the design of charge transport element 766 can be around less than 1 nm for a +/−5 Vpp. Fourth material 764 can be thicker than first, second, and third materials 761-1, 761-2, and 762. For instance, fourth material 764 can have a thickness between 3-5 nm. Further, less non-volatile charge storage element 753 can have a thickness of about 3 to 4 nm, and non-volatile charge storage element 755 can have a thickness of about 3 to 5 nm. Further, the charge blocking element of cell 703 can have a thickness of 7 to 10 nm, and an EOT of approximately 2.0 nm. The stack EOT may be about 7 nm for the +/−5 V design, with a physical thickness of about 27 to 30 nm.

During operation of cell 704, such as, for instance, during a program operation being performed on cell 704, a charge (e.g., electron) 767 may be transported from substrate element 760 through charge transport element 766 (e.g., through first material 761-1, third material 762, second material 761-2, and/or fourth material 764) to either less non-volatile charge storage element 763 or non-volatile charge storage element 765, as illustrated in FIG. 7. As an example, a program operation performed on cell 704 can include applying a program (e.g., write) voltage to cell 704, and whether the charge is transported to less non-volatile charge storage element 763 or non-volatile charge storage element 765 during the program operation may depend on the duration for which the program voltage is applied to the cell. For instance, a program voltage of +/−5.0 V applied to the cell for less than 50 ns may result in the charge being transported to less non-volatile charge storage element 763, while a program voltage of +/−5.0 V applied to the cell for 500 μs to 1 millisecond (ms) may result in the charge being transported to non-volatile charge storage element 765.

The charge 767 may be transported through charge transport element 766 by, for instance, direct tunneling through charge transport element 766. However, the charge may be transported through charge transport element 763 for trapping into non-volatile storage element 765 through either direct electron tunneling or by modified Fowler-Nordheim tunneling depending on the thickness of material 763. Therefore, L4 performance may vary significantly, and may be dependent on the design objective and thickness of element 763. Although the L4 performance may be comparable to previous NAND flash designs, this embodiment may have simultaneous fast L3 functionality and MLC design capacity within the same memory cell, while operating with an order of magnitude lower power.

FIG. 8 illustrates a portion of a multifunctional memory cell 805 in accordance with an embodiment of the present disclosure. For example, FIG. 8 illustrates an energy band diagram of multifunctional memory cell 805 having a crested barrier similar to the memory cell described in connection with FIG. 7 with a charge storage and trapping design for L4-L5 MLC high capacity applications. Cell 805 can be a low cost, higher performance memory cell that can provide both L4 and L5-MLS functionality with a significantly larger window as compared to the memory cell described in connection with FIG. 7 with the addition of two materials, while at the same time operating at relatively low power (e.g., Vpp=+/−5V). In an embodiment, cell 805 can comprise a stack that includes a charge transport element having an OR—SiON material between two $HfO_2$ materials, a nitride less non-volatile charge storage element for L3 functionality similar to the memory cell of FIG. 7, a non-volatile charge storage element having an $HfO_2$ material between two i-SRN materials, and a charge blocking element having a fixed negative charge interface between an $La_2O_3$ material and $Al_2O_3$ material. With a significantly larger memory window for MLC designs and a greater sense margin between memory states, the design may provide faster and more reliable sensing and consequently faster access and more robust MLC designs with higher capacity.

As shown in FIG. 8, cell 805 can include a substrate element 870, a charge transport element 881 adjacent (e.g., in direct contact with) substrate element 870, a less non-volatile charge storage element 873 adjacent charge transport element 881, a non-volatile charge storage element 882 adjacent less non-volatile charge storage element 873, a charge blocking element 883 adjacent non-volatile charge storage element 882, and a gate element 879 adjacent charge blocking element 883. Substrate element 870 can be, for example, a silicon material, and gate element 879 can be an insulator-metal interface material such as, for instance, TaN or TiN.

In the example illustrated in FIG. 8, charge blocking element 883 includes a first material 876, a second material 878, and a negative charge interface 877 between first and second materials 876 and 878. First material 876 can be a $La_2O_3$ material, and second material 878 can be an $Al_2O_3$ material. Utilization of such materials for first material 876 and second material 878 can prevent leakage of charge stored in charge storage elements 873 and/or 882, as will be further described herein.

Less non-volatile (e.g., SRAM or DRAM) charge storage element 873 can be a nitride material, which can provide stability and a large retention window for the SRAM or DRAM functionality. Charge storage element 882 can include a charge trapping material 875 between two charge storage materials 874-1 and material 874-2, both of which can be a silicon-rich nitride material, such as, for instance, an injector silicon-rich nitride material, to enhance charge storage (e.g., the memory window). Charge trapping material 875 could be an $HfO_2$ material, which can provide high density of charge traps. A charge-free layer 876 adjacent to the storage materia 874-2 also interfaces the blocking material 878 with a large energy barrier. The specific blocking material, for instance, $Al_2O_3$, can react with material 876, for instance, $La_2O_3$, to provide at the mutual interface a high density of fixed negative charge preventing charge loss to the gate by creating a repulsive electro-static field. This can provide a very large L4-L5 memory window with MLC capacity. Furthermore, while storage element 873 can provide L2 functionality as with other previous memory cells discussed, a combined effect of materials 874-1 and 875 can provide L3 functionality. Similarly, a combination of materials 875, 874-2, 876 and fixed negative charge 877 can provide L4-L5 MLC capability.

In the example illustrated in FIG. 8, charge transport element 881 includes a first material 871-1, a second material 871-2, and a third material 872 between materials 871-1 and 871-2. First material 871-1 and second material 871-2 can both be an $HfO_2$ material, and third material 872 can be a high-K oxygen-rich silicon oxynitride material having a composition and fabrication analogous to that previously described for first material 311 of charge transport element 317 in connection with FIG. 3. Utilizing such materials for first material 871-1, second material 871-2, and third material 872 can have benefits analogous to those previously described for charge transport element 768 in connection with FIG. 7.

During operation of cell 805, such as, for instance, during a program operation being performed on cell 805, a charge (e.g., electron) 884 may be transported from substrate element 870 through charge transport element 881 (e.g., through first material 871-1) to either less non-volatile charge storage element 873 or non-volatile charge storage element 875 aided by either storage material 874-1 and/or 874-2, as illustrated in FIG. 8. The charge 884 may be transported through charge transport element 881 by, for instance, tunneling through charge transport element 881, and may subsequently be stored in storage material 874-1 and 874-2 as well as trapped in element 875. The tunneling transport characteristics may be similar to that discussed previously in connection with FIG. 7 with direct tunneling through the crested barrier.

The charge can then be trapped and stored by the charge storage element (e.g., charge storage element 873 or 882) to which it has been transported. Charge blocking element 883 can prevent the stored charge from leaking while it is being stored. For example, negative charge interface 877 may include fixed negative charges generated at the interface of first material 876 and second material 878 due to the post deposition anneal that may occur after materials 876 and 878 are deposited. These fixed negative charges can reduce and/or prevent charge loss to gate 879.

FIG. 9 illustrates a portion of a multifunctional memory cell 906 in accordance with an embodiment of the present disclosure. For example, FIG. 9 illustrates an energy band diagram of multifunctional memory cell 906 with a double layered direct tunnel crested barrier with a five-layer stack focused on lower power, lower cost, and high performance with an operational objection of Vpp=+/−5 V. Memory cell 906 can provide both L1-L2 functionality and L3 functionality, while consuming a low amount of power during operation (e.g., during program and/or erase operations performed on the cell), being cheap and/or easy to process (e.g., fabricate), and/or performing at a high speed (e.g., having increased speeds for program and/or erase operations performed on the cell). In an embodiment, cell 906 can comprise a stack that includes a charge transport element having an $HfO_2$ material and a lanthanum aluminate ($LaAlO_3$) material, an $Si_3N_4$ volatile charge storage element, a GaN non-volatile charge storage element, and an $La_2O_3$ charge blocking element. In an embodiment, cell 906 can comprise a stack that includes a charge transport element having an $HfO_2$ material and either an $Si_2ON_2$ material or an $La_2O_3$ material, a nitride less non-volatile charge storage element, a non-volatile charge storage element having a GaN material and an $La_2O_3$ material for blocking. In an embodiment, cell 906 can comprise a stack that includes a charge transport element having an HfLaSiON material and an $HfO_2$ material and either an $Si_2ON_2$ material or an $La_2O_3$ material, a nitride less non-volatile charge storage element having a nitride material and an i-SRN material, a non-volatile charge storage element having an a GaN material and an $La_2O_3$ material for blocking. In an embodiment, cell 906 can comprise a stack that includes a charge transport element having an $HfO_2$ material, a second charge transport element having an $Si_2ON_2$ or an $La_2O_3$ material, a less non-volatile charge storage element having a nitride material, and a non-volatile charge storage element having a GaN material and an $La_2O_3$ charge blocking material.

As shown in FIG. 9, cell 906 can include a substrate element 985, a charge transport element 992 adjacent (e.g., in direct contact with) substrate element 985, a less non-volatile charge storage element 988 adjacent charge transport element 992, a non-volatile charge storage element 989 adjacent volatile charge storage element 988, a charge blocking element 990 adjacent non-volatile charge storage element 989, and a gate element 991 adjacent charge blocking element 990. Substrate element 985 can be, for example, a silicon material, and gate element 991 can be an insulator-metal interface material such as, for instance, TaN or TiN.

In an embodiment (e.g., an embodiment in which cell 906 is a low cost, low power, high performance cell), charge blocking element 990 can be a $La_2O_3$ material. Utilizing such a material for charge blocking element 990 can prevent leakage of charge stored in charge storage elements 988 and/or 989 in a manner analogous to that previously described for charge blocking element 883 in connection with FIG. 8, and can provide dual carrier functionality for cell 906, as will be further described herein.

Cell 906 may operate simultaneously in multimode tunneling and may utilize both the silicon substrate and gate as carrier sources and as injecting electrodes. For example, during programming, electron source may be the silicon substrate and hole source may simultaneously be the TaN gate owing to a low energy barrier from either end ($HfO_2$ interfacing silicon 985 provides low barrier for electron while $La_2O_3$ at gate end provides low energy barrier for holes). However, since electrons from silicon will move by direct tunneling while holes from gate will move by modified Fowler Nordheim tunneling (tunneling distance may be about 10 nm due to the blocking layer thickness of $La_2O_3$), charge trapping in nitride would primarily be due to electrons injected from the silicon. Any injection of hole from the gate would enhance the internal field and consequently, electrons injected from the silicon will experience enhanced field. This may result in higher performance for L1-L2 functionality as well as L3 functionality enhancing electron trapping for both charge storage elements 988 and 989. This may be especially true when short programming pulses (e.g. 10 to 20 ns pulses). However, when programming pulses are longer, considerable hole injection will be initiated from the gate end and will get stored at element 989. This may reduce the memory window due to electron-hole compensation. A similar phenomenon could be operative when the gate polarity would be reversed for erasing. Therefore, the performance of the memory cell would depend on the pulsing scheme. Nevertheless, with optimized pulsing scheme, cell 906 could have lower cost and power and deliver higher performance.

Memory cell 906 may have a low EOT stack design and can operate with short programming pluses, for the reasons previously described. The stack EOT may be around 5-6 nm and may be significantly lower than other designs for operating in the regime of Vpp=+/−5V. The dual layer tunnel EOT of 992 may be around 0.6 to 0.7 nm, the combined trapping layer EOT (e.g., both storage elements 988 and 989) being less than 4 nm, and the blocking material EOT may be less than 1.3 nm. The L1-L2 functionality can be achieved through trapping and detrapping in storage element 988, whereas the L3 functionality can be derived from trapping and detrapping from charge storage element 989. L4 functionality may not be sought in such designs for reasons mentioned above. The design can provide L1-L2 functionality at +/−5V, 10-20 ns and L3 functionality at +/−5V, less than 100 ns using multiple 10 ns pulsing scheme.

In an embodiment (e.g., a low cost, high performance embodiment), less non-volatile charge storage element 988 can be a nitride material, such as, for instance, a $Si_3N_4$ material. In such an embodiment, non-volatile (e.g., NROM) charge storage element 989 can be a GaN material, which can have a negative conduction offset band with respect to silicon and provide a high trapping density and deeper level trapping. In such an embodiment, non-volatile charge storage element 989 can be a GaN material that provides working memory (e.g., NROM) L3 functionality.

During operation of cell 906, such as, for instance, during a program operation being performed on cell 906, a charge (e.g., electron) 993 may be transported from substrate element 985 through charge transport element 992 (e.g., through first material 986 and second material 987) to less non-volatile charge storage element 988 or non-volatile charge storage element 989, as illustrated in FIG. 9. All other operation attributes can be analogous to those previously described herein.

Figure 10:
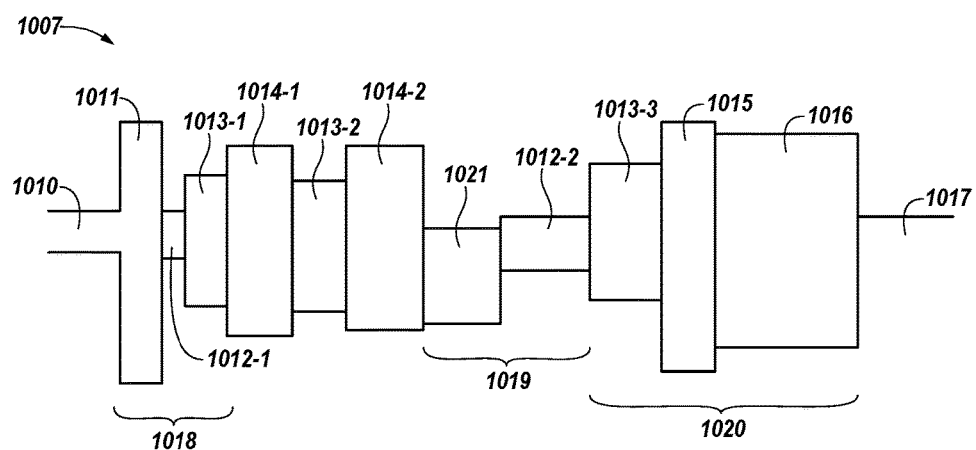
FIG. 10 illustrates a portion of a multifunctional memory cell in accordance with an embodiment of the present disclosure.

FIG. 10 illustrates a portion of a multifunctional memory cell 1007 in accordance with an embodiment of the present disclosure. Cell 1007 combines may of the transport, trapping, and blocking features described in the cell designs of FIGS. 3-9, and can provide simultaneously L1, L2, L3, and L4-L5 MLS functionality with an 11-layer design for operability at Vpp=+/−7 V. Further, cell 1007 can be an MLC having a large memory window, thereby achieving high storage density and/or capacity. For instance, cell 1007 can be a two level cell that can be programmed to a targeted one of four possible data states, or a triple level cell (TLC) that can be programmed to a targeted one of eight possible data states. In an embodiment, cell 1007 can comprise a stack that includes a charge transport element having an OR—SiON material, an i-SRN material, and an $La_2O_3$ material, a nitride volatile charge storage element, an additional $La_2O_3$ charge transport element, a non-volatile charge storage element having a GaN material and an i-SRN material, and a charge blocking element having an $La_2O_3$ material, an $Al_2O_3$ material, and an HfSiON material. In an embodiment, cell 1007 can comprise a stack that includes a charge transport element having an OR—SiON material, an $La_2O_3$ material, and either an i-SRN material or an $HfO_2$ material, a volatile charge storage element having a nitride material and an i-SRN material, a non-volatile charge storage element having a GaN material and an i-SRN material, and a charge blocking element having an $La_2O_3$ material, an $Al_2O_3$ material, and an HfLaON material.

As shown in FIG. 10, cell 1007 can include a substrate element 1010, a charge transport element 1018 adjacent (e.g., in direct contact with) substrate element 1010, a first volatile (e.g., SRAM) charge storage element 1014-1 adjacent charge transport element 1018, a second volatile (e.g., DRAM) charge storage element 1014-2, a non-volatile (e.g., NROM and/or NAND) charge storage element 1019 adjacent second volatile charge storage element 1014-2, a charge blocking element 1020 adjacent non-volatile charge storage element 1019, and a gate element 1017 adjacent charge blocking element 1020. Substrate element 1010 can be, for example, a silicon material, and gate element 1017 can be an insulator-metal interface material such as, for instance, TaN or TiN.

In the example illustrated in FIG. 10, charge blocking element 1020 includes a first material 1013-3, a second material 1016, and a third material 1015 between first and second materials 1013-3 and 1016 that can be a negative charge interface. First material 1013-3 can be a $La_2O_3$ material, second material 1016 can be a thermally stable, low leakage hafnium oxynitride material (e.g., HfLaON, HfAlON, HfTaON, or HfSiON) material with benefits analogous to those previously described for charge blocking element 316 in connection with FIG. 3, and third material 1015 can be an $Al_2O_3$ material. Utilization of such materials for first material 1013-3 and third material 1015 (e.g., the negative charge interface) can prevent leakage of charge stored in the charge storage elements, in a manner analogous to that previously described for charge blocking element 883 in connection with FIG. 8.

In the example illustrated in FIG. 10, non-volatile charge storage element 1019 can include a first non-volatile charge storage material 1021 and a second non-volatile charge storage material 1012-2. First material 1021 can be a GaN material, which can have a negative conduction offset band with respect to silicon and provide a high trapping density, and second material 1012-2 can be a silicon-rich nitride material, such as, for instance, an injector silicon-rich nitride material, to further enhance charge storage (e.g., the memory window) for the flash memory functionality. In the example illustrated in FIG. 10, first and second materials 1021 and 1012-2 can comprise a single non-volatile (e.g., NROM) charge storage element (e.g., 1019), and in an additional example, first and second materials 1021 and 1012-2 can comprise separate non-volatile (e.g., NROM and NAND, respectively) charge storage elements.

Further, in the example illustrated in FIG. 10, first and second volatile charge storage elements 1014-1 and 1014-2 can both be a nitride material, which can provide stability and a large retention window for the respective SRAM and DRAM functionalities. In an additional example (e.g., the example in which first and second non-volatile charge storage materials 1021 and 1012-2 comprise separate non-volatile charge storage elements), first volatile charge storage element 1014 can be a nitride material and second volatile charge storage element 1014-2 can be a silicon-rich nitride material (e.g., an injector silicon-rich nitride material). In such an example, the combined stack of volatile and non-volatile charge storage elements can have an EOT of 3 nm.

In the example illustrated in FIG. 10, charge transport element 1018 includes a first material 1011, a second material 1013-1, and a third material 1012-1 between materials 1011 and 1013-1. As illustrated in FIG. 10, memory cell 1007 (e.g., charge transport element 1018) may also include a fourth material 1013-2, which can be, for instance, an $La_2O_3$ material, between (e.g., in direct contact with) volatile charge storage elements 1014-1 and 1014-2. However, in an additional example (e.g., the example in which first and second non-volatile charge storage materials 1021 and 1012-2 comprise separate non-volatile charge storage elements), memory cell 1007 may not include fourth material 1013-2 (e.g., in such an example, volatile charge storage elements 1014-1 and 1014-2 are in direct contact with each other). Further, in an additional example, charge transport element 1018 may not include third material 1012-1 (e.g., in such an example, first material 1011 and second material 1013-1 are in direct contact with each other).

First material 1011 can be a high-K oxygen-rich silicon oxynitride material having a composition and fabrication analogous to that previously described for first material 311 of charge transport element 317 in connection with FIG. 3. Further, in the example illustrated in FIG. 8, second material 1013-1 can be an $La_2O_3$ material, and third material 1012-1 can be a silicon-rich nitride material (e.g., an injector silicon-rich nitride material) having a thickness of 1.0 to 1.5 nm to provide a retarding field for charges to be trapped in volatile charge storage element 1014-1. In an additional example, (e.g., the example in which first and second non-volatile charge storage materials 1021 and 1012-2 comprise separate non-volatile charge storage elements), second material 1013-1 can be an $HfO_2$ material and third material 1012-1 can be an $La_2O_3$ material. Utilizing such materials for charge transport element 1018 can have benefits analogous to those previously described for charge transport elements 317 and/or 429 in connection with FIGS. 3 and 4, respectively. Further, in such examples, charge transport element 1018 can have an EOT of 1.7 nm.

During operation of cell 1007, such as, for instance, during a program operation being performed on cell 1007, a charge (e.g., electron) may be transported from substrate element 1010 through charge transport element 1018 to first volatile charge storage element 1014-1, second volatile charge storage element 1014-2, or non-volatile charge storage element 1019 (e.g., first material 1021 or second material 1012-2). As an example, a program operation performed on cell 1007 can include applying a program (e.g., write) voltage to cell 1007, and the storage element to which the charge is transported during the program operation may depend on the duration for which the program voltage is applied to the cell. For instance, a program voltage of +/−7.0 V applied to the cell for 5 ns may result in the charge being transported to first volatile charge storage element 1014-1, a program voltage of +/−7.0 V applied to the cell for 20 ns may result in the charge being transported to second volatile charge storage element 1014-2, a program voltage of +/−7.0 V applied to the cell for 100 ns may result in the charge being transported to first non-volatile charge storage material 1021, and a program voltage of +/−7.0 V applied to the cell for 500 ns may result in the charge being transported to second non-volatile charge storage material 1012-2.

The charge may be transported through charge transport element 1018 by, for instance, tunneling through charge transport element 1018. For example, charge transport element 1018 can be a double layer PBO tunnel barrier (e.g., in examples in which charge transport element 1018 does not include third material 1012-1) or a triple layer PBO tunnel barrier (e.g., in examples in which charge transport element 1018 includes third material 1012-1) that can provide internal field-aided enhanced electron transport, and the charge may tunnel through the PBO tunnel barrier via direct electron tunneling (e.g. during programming) or hole tunneling (e.g. during erasing). Further, in the example illustrated in FIG. 10 (e.g., in which cell 8010 includes fourth material 1013-2), there may be additional direct tunneling of the charge through fourth material 1013-2 to (e.g. during programming) and/or from (e.g., during erasing) second volatile charge storage element 1014-2, but no hole tunneling.

The charge can then be trapped and stored by the charge storage element to which it has been transported. Charge blocking element 1020 can prevent the stored charge from leaking while it is being stored, as previously described herein.

FIG. 11 illustrates a portion of a multifunctional memory cell 1109 in accordance with an embodiment of the present disclosure. For example, FIG. 11 illustrates a partial energy band diagram of multifunctional memory cell 1109. Cell 1109 is an additional example of a CRESTED barrier tunneling layer design that is similar to the cells previously described in connection with FIGS. 7 and 8. The design is a six-layer stack uses well-characterized dielectric films with a single-tool deposition scheme for a low cost memory cell that can provide L2, L3, and L4 functionality. For instance, the elements of cell 1109 can all be deposited using common processing tools, such as Low-Pressure-Chemical-Vapor-Deposition (LPCVD) tools. In an embodiment, cell 1109 can comprise a stack that forms a two-layer CRESTED tunnel barrier comprising a thin layer of $Si_2ON_2$ material interfacing a silicon substrate with an HfSiON material to form the tunnel barrier. Further, the stack can include a nitride less non-volatile charge trapping element, an additional $Si_2ON_2$ material as the second charge trapping element, an i-SRN charge storage element, and an HfSiON charge blocking element.

As shown in FIG. 11, cell 1109 can include a substrate element 1150, a double-layered charge transport element 1158 adjacent (e.g., in direct contact with) substrate element 1150, a less non-volatile (e.g., DRAM) charge trapping element 1153 adjacent charge transport element 1158, a second charge trapping element 1154 adjacent the first charge trapping element 1153, a charge storage element 1155 adjacent element 1154, and a charge blocking element 1156 adjacent charge storage element 1155, and a gate element 1157 adjacent charge blocking element 1156. Substrate element 1150 can be, for example, a silicon material, and gate element 1157 can be an insulator-metal interface material such as, for instance, TaN or TiN.

Charge blocking element 1156 can be a thermally stable, low leakage hafnium oxynitride material (e.g., HfLaON, HfAlON, HfTaON, or HfSiON) with benefits analogous to those previously described for charge blocking element 316 in connection with FIG. 3. Charge blocking element 1156 can have a thickness of 7 nm, for instance.

In the example illustrated in FIG. 11, less non-volatile charge storage element 1153 can be a nitride (e.g., $Si_3N_4$) material that provides fast charge trapping and de-trapping for DRAM functionality. First non-volatile charge storage element 1154 can be a $Si_2ON_2$ material that can provide deeper charge trapping, and therefore, greater stability and a larger retention window. Second non-volatile charge storage element 1155 can be a silicon-rich nitride material (e.g., an injector silicon-rich nitride material) to further enhance charge storage (e.g., the memory window) for the flash memory functionality.

In the example illustrated in FIG. 11, charge transport element 1158 includes a first material 1151 and a second material 1152. First material 1151 can be an ultrathin $Si_2ON_2$ material that can provide interface stability with substrate element 1150, or an ultrathin $Si_3N_4$ material that can provide a low energy barrier for enhanced charge transport. Second material 1152 can be an HfSiON material, which can provide benefits analogous to those previously described for charge transport element 656 in connection with FIG. 6.

Charge transport element 1158 can have an EOT of 1 nm, storage elements 1153, 1154, and 1155 can have a combined EOT of 3 nm, and charge blocking element 1156 can have an EOT of 2 nm. The combined EOT for the stack comprising charge transport element 1158, storage elements 1153, 1154, and 1155, and charge blocking element 1156 can be approximately 6 nm for a low-power Vpp=+/−5 V design.

During operation of cell 1109, such as, for instance, during a program operation being performed on cell 1109, a charge (e.g., electron) 1159 may be transported from substrate element 9050 through charge transport element 1158 (e.g., through first material 1151 and second material 1152) to less non-volatile charge storage element 1153, first non-volatile charge storage element 1154, or second non-volatile charge storage element 1155, as illustrated in FIG. 11. As an example, a program operation performed on cell 1155 can include applying a program (e.g., write) voltage to cell 1155, and the storage element to which the charge is transported during the program operation may depend on the duration for which the program voltage is applied to the cell. For instance, a program voltage of +/−5 V applied to the cell for less than 50 ns may result in the charge being transported to less non-volatile charge storage element 1153, a program voltage of +/−5 V applied to the cell for 500-1000 ns may result in the charge being transported to first non-volatile charge storage element 1154, and subsequently gets transported to second non-volatile charge storage element 1155.

The charge 1159 may be transported through charge transport element 1158 by, for instance, tunneling through charge transport element 1158. For example, the charge may be transported through charge transport element 1158 to less non-volatile trapping element 1153 and/or non-volatile trapping elements 1154 and 1155 through direct electron tunneling. For instance, charge transport element 1158 can be a crested tunnel barrier, which can have characteristics and benefits analogous to those previously described for charge transport element 766 in connection with FIG. 7.

The charge can then be trapped and stored by the charge storage element to which it has been transported. Charge blocking element 1156 can prevent the stored charge from leaking while it is being stored, as previously described herein.

One characteristic of MSUM cell designs described herein is the application of multiple trapping dielectric materials with intrinsic trapping properties of trap density (often expressed in terms of capture probability) and trap energy depth and placement of such materials with reference to the charge sources, (e.g., the semiconductor substrate (silicon)) and the gate of the NVM gate stack design. Well characterized trapping dielectric (e.g., silicon nitride (SiN4)) along with deep offset trapping dielectric (e.g., GaN) have been used and placed appropriately in the MSUM cell designs to achieve simultaneous multifunctionality with desirable performance in the MSUM device illustrations discussed earlier. The significance of specific MSUM cell stack design and the associated pulsing scheme to efficiently inject and store charges deriving appropriate memory properties (e.g., window, retention, endurance, durability, MLC-capability, multi-functionality) has been described herein. By placing multiple trapping dielectric materials with different trapping properties at variable distances from charge sources, a variable functionality with variable performance could be achieved, which can be tuned to pulsing schemes [(+/−Vpp) and pulse durations)] to achieve simultaneously desired multi-functionality and performance characteristics for the MSUM cell. The following cell design addresses such an MSUM design by incorporating ultra-thin film laminates of inter-combed nitride and GaN materials placed between the tunneling layers and the blocking layer (or layers) for the MSUM cell stack design. Many variations of such scheme are possible but will not be specifically illustrated here.

Figure 12:
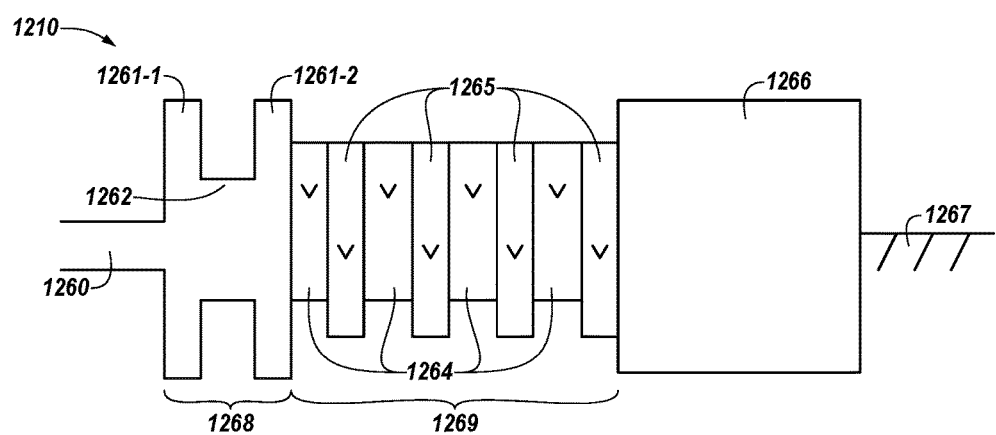
FIG. 12 illustrates a portion of a multifunctional memory cell in accordance with an embodiment of the present disclosure.

FIG. 12 illustrates a portion of a multifunctional memory cell 1210 in accordance with an embodiment of the present disclosure. For example, FIG. 12 illustrates a stack design concept for a variable functionality, variable performance MSUM design comprising multiple layering of two dielectric materials (e.g., nitride with a shallower trap, and GaN with deeper traps) adjacent to each other as inter-combed laminates in the form of a partial energy band diagram. Cell 1210 can comprise, for example, a triple-layered tunneling design 1268, with multiple pairs of nitride-GaN laminates 1269 for charge storage placed between charge transport element 1268 and charge blocking element 1266. By trapping and storing charges at different locations and detrapping such charges through a write-erase pulsing scheme, different functionality and associated performance such as L1-L2, L3, L4-L5, and MLC functionality can be simultaneously achieved.

In the example shown in FIG. 12, a three-layered direct tunneling VARIOT barrier 1268 is illustrated, comprising an $HfO_2$ material 1262 sandwiched between two layers of ultra-thin OR—SiON materials 1261-1 and 1261-2. The charge storage design 1269 illustrated comprises, for example, four pairs of thin laminates, each comprising nitride material 1264 and GaN material 1265. The blocking element 1266 comprises a thicker layer of HfLaON and optionally may include a charge storage layer of I-SRN material and an adjacent thin layer of $Al_2O_3$ adjacent to 1269 and between 1269 and 1266 to further enhance MLC capability.

As shown in FIG. 12, cell 1210 can include a substrate element 1260, a charge transport element 1268 adjacent (e.g., in direct contact with) substrate element 1260, a charge storage element 1269 adjacent charge transport element 1268, a charge blocking element 1266 adjacent charge storage element 1269, and a gate element 1267 adjacent charge blocking element 1266. Substrate element 1260 can be, for example, a silicon material, and gate element 1267 can be an insulator-metal interface material such as, for instance, TaN or TiN.

In an embodiment, charge blocking element 1266 can be a thermally stable, low leakage hafnium oxynitride material (e.g., HfLaON, HfAlON, HfTaON, or HfSiON) with benefits analogous to those previously described for charge blocking element 316 in connection with FIG. 3. In an embodiment, charge blocking element 1266 can include a silicon-rich nitride material (e.g., i-SRN) adjacent charge storage element 1269, an $Al_2O_3$ material adjacent the silicon-rich nitride material, and a hafnium oxynitride material (e.g., HfLaON) adjacent the $Al_2O_3$ material. Utilization of such materials for charge blocking element 1266 can provide for simultaneous storage of at least 3 bits for multilevel memory (e.g., 8 memory states for TLC memory) with L2, L3, and L4 functionality.

As shown in FIG. 12, charge storage element 1269 can include a number of alternating nitride materials 1264 and GaN materials 1265 corresponding to different memory levels. For instance, charge storage element 1269 can include a first nitride material adjacent charge transport element 1268, a first GaN material adjacent the first nitride material, a second nitride material adjacent the first GaN material, a second GaN material adjacent the second nitride material, and so on. Utilizing nitride and GaN materials in charge storage element 1269 can have benefits analogous to those previously described herein.

In the example illustrated in FIG. 12, charge transport element 1268 includes a first material 1261-1, a second material 1261-2, and a third material 1262 between materials 1261-1 and 1262-2. First material 1261-1 and second material 1262-2 can both be a high-K oxygen-rich silicon oxynitride material having a composition and fabrication analogous to that previously described for first material 311 of charge transport element 317 in connection with FIG. 3. Third material 1262 can be an HfO$_2$ material. Utilizing such materials in charge transport element 1268 can have benefits analogous to those previously described herein.

First material 1261-1 can have a thickness of 1 nm, second material 1261-2 can have a thickness of 1-1.5 nm, and third material 1262 can have a thickness of 2-3 nm. Further, each respective nitride material 1264 and GaN material 1265 of charge storage element 1269 can have a thickness of 1 nm. In the embodiment in which charge blocking element 1266 is a hafnium oxynitride material, charge blocking element 1266 (e.g., the hafnium oxynitride material) can have a thickness of 8 nm. The MSUM stack design 1210 can have an EOT of 6.9 nm, and optionally with an MLC design could have an EOT of approximately 8.9 nm. The thinner EOT (E.g., 6.9 nm) would be designed for Vpp=+/−5 V, whereas the thicker EOT design (e.g., 8.9 nm) would be designed for Vpp=+/−7 V. In the embodiment in which charge blocking element 1266 includes a silicon-rich nitride material, an Al$_2$O$_3$ material, and a hafnium oxynitride material, those materials can have thicknesses of 4 nm, 2 nm, and 8 nm, respectively, and the stack comprising charge transport element 1268, storage element 1269, and charge blocking element 1266 can have an EOT of 8.9 nm.

During operation of cell 1210, such as, for instance, during a program operation being performed on cell 1210, a charge (e.g., electron) may be transported from substrate element 1260 through charge transport element 1268 (e.g., through first material 1261-1, third material 1262, and second material 1261-2) to one of the nitride materials 1264 or GaN materials 1265 of charge storage element 1269. The charge may be transported through charge transport element 1268 by, for instance, tunneling through charge transport element 1268.

As an example, a program operation performed on cell 1210 can include applying a program (e.g., write) voltage to cell 1201, and which nitride or GaN material (e.g., which memory level) the charge is transported to during the program operation may depend on the duration for which the program voltage and duration of the program pulse is applied to the cell. The charge can then be trapped and stored in the material (e.g. level) to which it is transported. For erasing, the program potential and pulse characteristics at the gate would be reversed for detrapping the charges.

The programming for different levels may be fast from trapping and de-trapping from the nitride materials at different tunnel distances for L1 (e.g., closest to substrate element 1260), and may be successively longer from trapping at increasing tunnel distances. The deeper trapping levels of trapping in the GaN materials at different tunnel distances may provide longer retention and refresh time, which can increase exponentially for charges trapped further from substrate element 1260.

For instance, in the embodiment in which charge blocking element 1266 is a hafnium oxynitride material, a program voltage of +/−5 V applied to the cell for 3 ns may result in the charge being transported to L1, a program voltage of +/−5 V applied to the cell for 30 ns may result in the charge being transported to L2, a program voltage of +/−5 V applied to the cell for 300 ns may result in the charge being transported to L3, and a program voltage of +/−5 V applied to the cell for 30,000 ns may result in the charge being transported to L4. As an additional example, in the embodiment in which charge blocking element 1266 includes a silicon-rich nitride material, an Al$_2$O$_3$ material, and a hafnium oxynitride material, a program voltage of +/−7 V applied to the cell for 10 ns may result in the charge being transported to L2, a program voltage of +/−7 V applied to the cell for 100 ns may result in the charge being transported to L3, and a program voltage of +/−7 V applied to the cell for 30,000 ns may result in the charge being transported to L4.

Figure 13:
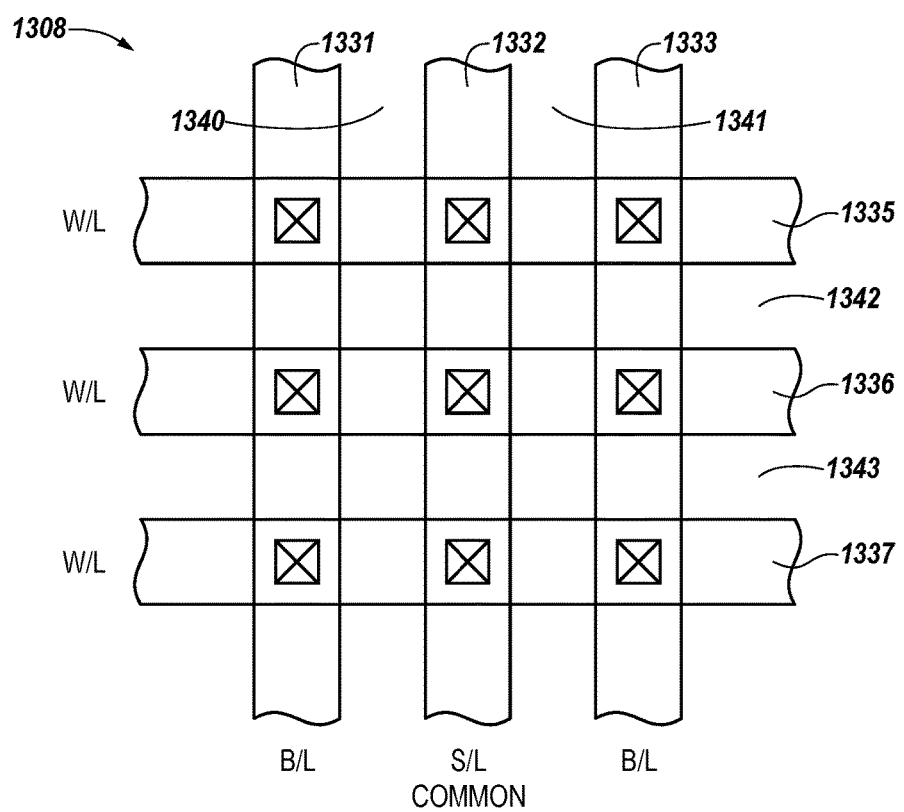
FIG. 13 illustrates a memory array having multifunctional memory cells in accordance with an embodiment of the present disclosure.

FIG. 13 illustrates a memory array 1308 having multifunctional memory cells in accordance with an embodiment of the present disclosure. For instance, array 1308 can include multifunctional memory cells previously described herein in connection with any of FIGS. 3-11. Array 1308 can be, for instance, a three-dimensional array in which the multifunctional memory cells are vertically stacked, planar multifunctional memory cells.

As shown in FIG. 13, array 1308 can include access (e.g., word) lines 1335-1337 that extend in the x-direction, and data (e.g., bit) lines 1331-1333 that extend substantially perpendicular in the y-direction. A multifunctional memory cell in accordance with the present disclosure can be located at the intersection of each respective word line and bit line, as illustrated in FIG. 13.

Isolation areas 1340, 1341 can be formed between the bit lines 1331, 1332 and 1332, 1333, respectively, while isolation areas 1342, 1343 can be formed between the word lines 1335, 1336 and 1336, 1337, respectively. A common source line can be formed in the memory array and commonly coupled to the bit lines 1331, 1333 for devices on either side (left or right).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
a charge transport element having an oxygen-rich silicon oxynitride material;
a volatile charge storage element configured to store a first charge transported through the charge transport element; and
a non-volatile charge storage element configured to store a second charge transported through the charge transport element, wherein the non-volatile charge storage element includes a gallium nitride material; and
an additional volatile charge storage element configured to store a third charge transported through the charge storage element.

2. The memory cell of claim 1, wherein the non-volatile charge storage element includes a silicon-rich nitride material.

3. The memory cell of claim 1, wherein the memory cell includes a charge blocking element configured to prevent leakage of the first charge stored by the volatile charge storage element and leakage of the second charge stored by the non-volatile storage element.

4. The memory cell of claim 3, wherein the charge blocking element includes an oxynitride material.

5. The memory cell of claim 3, wherein the charge blocking element includes an aluminum oxide material.

6. The memory cell of claim 1, wherein the memory cell includes a lanthanum oxide material between the volatile charge storage element and the additional volatile charge storage element.

7. The memory cell of claim 1, wherein the charge transport element includes a hafnium dioxide material.

8. The memory cell of claim 1, wherein the volatile charge storage element includes a nitride material.

9. The memory cell of claim 8, wherein the nitride material is a silicon nitride material.

10. The memory cell of claim 8, wherein the nitride material is a silicon oxynitride material.

11. The memory cell of claim 1, wherein the charge transport element includes an additional oxynitride material.

12. The memory cell of claim 11, wherein the charge transport element includes:
a first oxygen-rich silicon oxynitride material; and
a second oxygen-rich silicon oxynitride material;
wherein the additional oxynitride material is between the first oxygen-rich silicon oxynitride material and the second oxygen-rich silicon oxynitride material.

13. The memory cell of claim 1, wherein:
the charge transport element includes a lanthanum oxide material; and
the memory cell includes an additional lanthanum oxide material between the volatile charge storage element and the non-volatile charge storage element.

14. A memory cell, comprising:
a charge transport element having a hafnium dioxide material;
a volatile charge storage element configured to store a first charge transported through the charge transport element; and
a non-volatile charge storage element configured to store a second charge transported through the charge transport element, wherein the non-volatile charge storage element includes a gallium nitride material; and
an additional non-volatile charge storage element configured to store a third charge transported through the charge transport element.

15. The memory cell of claim 14, wherein the charge transport element includes a lanthanum aluminate material.

16. The memory cell of claim 14, wherein the charge transport element includes a lanthanum oxide material.

17. The memory cell of claim 14, wherein the memory cell includes a charge blocking element having a lanthanum oxide material configured to prevent leakage of the first charge stored by the volatile charge storage element and leakage of the second charge stored by the non-volatile storage element.

18. The memory cell of claim 14, wherein the charge transport element is a crested tunnel barrier.

19. The memory cell of claim 14, wherein the charge transport element includes:
a first hafnium dioxide material;
a second hafnium dioxide material; and
an aluminum oxide material between the first hafnium dioxide material and the second hafnium dioxide material.

20. The memory cell of claim 14, wherein the memory cell includes an oxynitride material between the volatile charge storage element and the non-volatile charge storage element.

21. The memory cell of claim 14, wherein:
the volatile charge storage element is a dynamic random access memory (DRAM) storage element; and
the non-volatile charge storage element is an NROM memory storage element.

22. An apparatus, comprising:
an array of memory cells, wherein each respective memory cell of the array includes:
a charge transport element having an oxygen-rich silicon oxynitride material;
a volatile charge storage element configured to store a first charge transported through the charge transport element; and
a non-volatile charge storage element configured to store a second charge transported through the charge transport element, wherein the non-volatile charge storage element includes a silicon-rich nitride material;
an additional volatile charge storage element configured to store a third charge transported through the charge transport element, wherein the additional volatile charge storage element includes a silicon-rich nitride material; and
an additional non-volatile charge storage element configured to store a fourth charge transported through the charge transport element, wherein the additional non-volatile charge storage element includes a silicon-rich nitride material.

23. The apparatus of claim 22, wherein the charge transport element of each respective memory cell of the array is a progressive band offset tunnel barrier.

24. The apparatus of claim 22, wherein the charge transport element of each respective memory cell of the array is a variable oxide thickness tunnel barrier.

25. The apparatus of claim 22, wherein each respective memory cell of the array is a multilevel memory cell.

26. The apparatus of claim 22, wherein each respective memory cell of the array is a vertically stacked planar memory cell.

27. The apparatus of claim 22, wherein the charge transport element of each respective memory cell of the array includes:
   a first hafnium dioxide material;
   a second hafnium dioxide material; and
   the oxygen-rich silicon oxynitride material is between the first hafnium dioxide material and the second hafnium dioxide material.

28. The apparatus of claim 22, wherein the non-volatile storage element of each respective memory cell of the array includes:
   an additional silicon-rich nitride material; and
   a hafnium dioxide material between the silicon-rich nitride material and the additional silicon-rich nitride material.

29. The apparatus of claim 22, wherein the charge transport element of each respective memory cell of the array includes a silicon-rich nitride material.

30. A method of operating a memory cell, comprising:
   transporting a charge through a hafnium oxynitride material of the memory cell to at least one of:
      a volatile charge storage element of the memory cell;
      a non-volatile charge storage element of the memory cell having a silicon-rich nitride material; and
      an additional non-volatile charge storage element of the memory cell having a silicon oxynitride material; and
   storing, by the charge storage element to which the charge is transported, the charge.

31. The method of claim 30, wherein the method includes transporting the charge through an additional nitride material of the memory cell to at least one of:
   the volatile charge storage element of the memory cell; and
   the non-volatile charge storage element of the memory cell.

32. The method of claim 30, wherein the hafnium oxynitride material is a hafnium silicon oxynitride material.

33. The method of claim 30, wherein the hafnium oxynitride material is a hafnium lanthanum oxynitride material.

34. A method of operating a memory cell, comprising:
   transporting a charge through a hafnium oxynitride material of the memory cell to at least one of:
      a volatile charge storage element of the memory cell;
      a non-volatile charge storage element of the memory cell having a silicon-rich nitride material; and
      an additional non-volatile charge storage element of the memory having a hafnium dioxide material; and
   storing, by the charge storage element to which the charge is transported, the charge.

* * * * *